US011937457B2

(12) United States Patent
Seon et al.

(10) Patent No.: US 11,937,457 B2
(45) Date of Patent: Mar. 19, 2024

(54) DISPLAY DEVICE

(71) Applicant: Samsung Display Co., Ltd., Yongin-Si (KR)

(72) Inventors: Jong Baek Seon, Yongin-si (KR); Deok Hoi Kim, Seongnam-si (KR); Hun Kim, Seoul (KR)

(73) Assignee: Samsung Display Co., Ltd., Yongin-si (KR)

( * ) Notice: Subject to any disclaimer, the term of this patent is extended or adjusted under 35 U.S.C. 154(b) by 289 days.

(21) Appl. No.: 17/410,699

(22) Filed: Aug. 24, 2021

(65) Prior Publication Data

US 2022/0165825 A1 May 26, 2022

(30) Foreign Application Priority Data

Nov. 23, 2020 (KR) .......................... 10-2020-0157726

(51) Int. Cl.
*H10K 59/121* (2023.01)
*H01L 27/12* (2006.01)
(Continued)

(52) U.S. Cl.
CPC ...... *H10K 59/1213* (2023.02); *H01L 27/1218* (2013.01); *H10K 77/111* (2023.02); *H10K 2102/311* (2023.02)

(58) Field of Classification Search
CPC ............. H10K 59/1213; H10K 77/111; H10K 2102/311; H10K 59/12; H10K 77/10;
(Continued)

(56) References Cited

U.S. PATENT DOCUMENTS 11,690,247 B2 * 6/2023 Choi .................... H10K 59/353
257/40
2016/0197129 A1 * 7/2016 Kang ................... H10K 59/127
257/40
(Continued)

FOREIGN PATENT DOCUMENTS

KR        10-0946960 B1      3/2010
KR    10-2011-0067411 A      6/2011
(Continued)

OTHER PUBLICATIONS

Yaqiang Liu, Qingqing Chen, Xuelian Du, "Effect of direct fluorination on surface and electrical properties of polyimide thin films", Elsevier (journal), Materials Letters vol. 223, Jul. 15, 2018, pp. 207-209, Amsterdam, Netherlands.

*Primary Examiner* — J. E. Schoenholtz
(74) *Attorney, Agent, or Firm* — Innovation Counsel LLP

(57) ABSTRACT

A display device is provided. The display device comprises a first base substrate, a first barrier layer disposed on the first base substrate, a second base substrate disposed on the first barrier layer, a first sub-substrate disposed on the second base substrate and comprising at least one dopant selected from a group consisting of: fluorine (F), boron (B), arsenic (As), phosphorus (P), chlorine (Cl), bromine (Br), iodine (I), astatine (At), sulfur (S), selenium (Se), argon (Ar), and tellurium (Te), a second barrier layer disposed on the first sub-substrate, a second buffer layer disposed on the second barrier layer, a first buffer layer disposed on the second buffer layer, at least one transistor disposed on the first buffer layer, and an organic light-emitting diode disposed on the at least one transistor.

21 Claims, 23 Drawing Sheets

(51) Int. Cl.
*H10K 77/10* (2023.01)
*H10K 102/00* (2023.01)

(58) Field of Classification Search
CPC ............. H01L 27/1218; H01L 27/1225; H01L 27/1251; H01L 27/1255
See application file for complete search history.

(56) References Cited

U.S. PATENT DOCUMENTS

| | | | |
|---|---|---|---|
| 2018/0018907 A1* | 1/2018 | Kim | G09F 9/301 |
| 2021/0005693 A1* | 1/2021 | Cho | H10K 59/1213 |

FOREIGN PATENT DOCUMENTS

| | | |
|---|---|---|
| KR | 10-1401733 B1 | 5/2014 |
| KR | 10-1491274 B1 | 2/2015 |
| KR | 10-1645064 B1 | 8/2016 |
| KR | 10-2018-0047308 A | 5/2018 |
| KR | 10-2019-0014230 A | 2/2019 |
| KR | 10-1989027 B1 | 6/2019 |
| WO | 2017-111299 A1 | 6/2017 |

* cited by examiner

120: 121
130: 131, 133
150: 151
160: 161, 162, 163, 164, 165
170: 171
ST: 145, 151, 161, 162
DT: 105, 121, 164, 165

120: 121
130: 131, 133
150: 151
160: 161, 162, 163, 164, 165
170: 171
ST: 145, 151, 161, 162
DT: 105, 121, 164, 165

DISPLAY DEVICE

This application claims priority from Korean Patent Application No. 10-2020-0157726 filed on Nov. 23, 2020, in the Korean Intellectual Property Office, the disclosure of which is incorporated herein by reference in its entirety.

BACKGROUND

1. Field of the Disclosure

The present disclosure relates to a display device.

2. Description of the Related Art

As the information-oriented society evolves, various demands for display devices to display images are ever increasing. Display devices include liquid-crystal displays (LCDs), plasma display panels (PDPs), organic light-emitting displays (OLEDs), micro light-emitting diode displays, etc.

A display device includes light-emitting diodes and a plurality of thin-film transistors connected to the light-emitting diodes. The plurality of thin-film transistors may include a thin-film transistor including polycrystalline silicon or a thin-film transistor including oxide. A thin-film transistor containing polycrystalline silicon has an advantage in that it can supply driving current stably. A thin-film transistor containing oxide has advantages in that it can be turned on quickly and exhibits good off-current characteristics.

SUMMARY

Aspects of the present disclosure provide a display device that can improve electrical characteristics of thin-film transistors by suppressing electron charging and interfacial polarization in the substrate.

It should be noted that features of the present disclosure are not limited to the above-mentioned features; and other features of the inventive concept will be apparent to those skilled in the art from the following descriptions.

According to embodiments of the present disclosure, a sub-substrate includes a dopant and a barrier layer includes a material having a dielectric constant higher than a dielectric constant of the sub-substrate, so that electron charging and interfacial polarization that may occur at the interface between the sub-substrate and the barrier layer can be suppressed.

In addition, according to an embodiment of the present disclosure, it is possible to improve the display quality of a display device by improving the electrical characteristics of thin-film transistors to reduce afterimages on the screen.

It should be noted that effects of the present disclosure are not limited to those described above and other effects of the present disclosure will be apparent to those skilled in the art from the following descriptions.

According to an embodiment of the disclosure, a display device comprises a first base substrate, a first barrier layer, a second base substrate, a first sub-substrate, a second barrier layer, a second buffer layer, a first buffer layer, at least one transistor, and an organic light-emitting diode. The first barrier layer is disposed on the first base substrate. The second base substrate is disposed on the first barrier layer. The first sub-substrate is disposed on the second base substrate and comprises at least one dopant selected from a group consisting of: fluorine (F), boron (B), arsenic (As), phosphorus (P), chlorine (Cl), bromine (Br), iodine (I), astatine (At), sulfur (S), selenium (Se), argon (Ar), and tellurium (Te). The second barrier layer is disposed on the first sub-substrate. The second buffer layer is disposed on the second barrier layer. The first buffer layer is disposed on the second buffer layer. The at least one transistor is disposed on the first buffer layer. The organic light-emitting diode is disposed on the at least one transistor.

In an embodiment, the first sub-substrate is in contact with the second barrier layer, and a dielectric constant of the first sub-substrate is smaller than a dielectric constant of the second barrier layer.

In an embodiment, the dielectric constant and a specific resistance of each of the first sub-substrate and the second barrier layer satisfy the following relational expression:

$$\varepsilon_1 p_1 \neq \varepsilon_2 p_2$$

wherein $\varepsilon_1$ denotes the dielectric constant of the first sub-substrate, $p_1$ denotes the specific resistance of the first sub-substrate, $\varepsilon_2$ denotes the dielectric constant of the second barrier layer, and $p_2$ denotes the specific resistance of the second barrier layer.

In an embodiment, a value of $\varepsilon_1 p_1$ of the first sub-substrate is greater than a value $\varepsilon_2 p_2$ of the second barrier layer.

In an embodiment, the dielectric constant of the first sub-substrate ranges from 2 to 3.8.

In an embodiment, a concentration of the dopant decreases from an upper surface of the first sub-substrate in contact with the second barrier layer to a lower surface of the first sub-substrate.

In an embodiment, a concentration of the dopant of the first sub-substrate is generally uniform.

In an embodiment, the second barrier layer has a dielectric constant of 5 or more, and comprises at least one selected from a group consisting of: SiON, SiNx, $Al_2O_3$, $ZrO_2$, $HfO_2$, $TiO_2$ and $TaO_2$.

In an embodiment, the first buffer layer has a dielectric constant of 5 or more, and comprises at least one selected from a group consisting of: SiON, SiNx, $Al_2O_3$, $ZrO_2$, $HfO_2$, $TiO_2$ and $TaO_2$.

In an embodiment, the display device further comprises a third barrier layer disposed between the second barrier layer and the second buffer layer, wherein a dielectric constant of the third barrier layer is smaller than the dielectric constant of the second barrier layer.

According to an embodiment of the disclosure, a display device comprises a first base substrate, a first barrier layer, a first sub-substrate, a second base substrate, a second barrier layer, a second buffer layer, a first buffer layer, at least one transistor, and an organic light-emitting diode. The first barrier layer is disposed on the first base substrate. The first sub-substrate is disposed on the first barrier layer and comprises at least one dopant selected from a group consisting of: fluorine (F), boron (B), arsenic (As), phosphorus (P), chlorine (Cl), bromine (Br), iodine (I), astatine (At), sulfur (S), selenium (Se), argon (Ar), and tellurium (Te). The second base substrate is disposed on the first sub-substrate. The second barrier layer is disposed on the second base substrate. The second buffer layer is disposed on the second barrier layer. The first buffer layer is disposed on the second buffer layer. The at least one transistor is disposed on the first buffer layer. The organic light-emitting diode is disposed on the at least one transistor. A surface of the first sub-substrate is in contact with the first barrier layer and an opposite surface of the first sub-substrate is in contact with the second base substrate. A dielectric constant of the first sub-substrate is smaller than a dielectric constant of the first barrier layer and a dielectric constant of the second base substrate.

In an embodiment, the first barrier layer has the dielectric constant of 5 or more, and comprises at least one selected from a group consisting of: SiON, SiNx, $Al_2O_3$, $ZrO_2$, $HfO_2$, $TiO_2$ and $TaO_2$.

In an embodiment, at least one of the second barrier layer and the first buffer layer has a dielectric constant of 5 or more, and comprises at least one selected from a group consisting of: SiON, SiNx, $Al_2O_3$, $ZrO_2$, $HfO_2$, $TiO_2$ and $TaO_2$.

In an embodiment, the dielectric constant of the first sub-substrate ranges from 2 to 3.8.

According to an embodiment of the disclosure, a display device comprises a first base substrate, a first sub-substrate, a first barrier layer, a second sub-substrate, a second barrier layer, a second buffer layer, a first buffer layer, at least one transistor, and an organic light-emitting diode. The first sub-substrate is disposed on the first base substrate and comprises at least one dopant selected from a group consisting of: fluorine (F), boron (B), arsenic (As), phosphorus (P), chlorine (Cl), bromine (Br), iodine (I), astatine (At), sulfur (S), selenium (Se), argon (Ar), and tellurium (Te). The first barrier layer is disposed on the first sub-substrate. The second sub-substrate is disposed on the first barrier layer and comprises at least one dopant selected from a group consisting of: fluorine (F), boron (B), arsenic (As), phosphorus (P), chlorine (Cl), bromine (Br), iodine (I), astatine (At), sulfur (S), selenium (Se), argon (Ar), and tellurium (Te). The second barrier layer is disposed on the second sub-substrate. The second buffer layer is disposed on the second barrier layer. The first buffer layer is disposed on the second buffer layer. The at least one transistor is disposed on the first buffer layer. The organic light-emitting diode is disposed on the at least one transistor. A surface of the first barrier layer is in contact with the first sub-substrate and an opposite surface of the first barrier layer is in contact with the second sub-substrate. A dielectric constant of the first barrier layer is greater than a dielectric constant of the first sub-substrate and a dielectric constant of the second sub-substrate.

In an embodiment, the second barrier layer has a dielectric constant of 5 or more, and comprises at least one selected from a group consisting of: SiON, SiNx, $Al_2O_3$, $ZrO_2$, $HfO_2$, $TiO_2$ and $TaO_2$.

In an embodiment, the first buffer layer has a dielectric constant of 5 or more, and comprises at least one selected from a group consisting of: SiON, SiNx, $Al_2O_3$, $ZrO_2$, $HfO_2$, $TiO_2$ and $TaO_2$.

In an embodiment, the display device further comprises a third barrier layer disposed between the first barrier layer and the second sub-substrate, and a fourth barrier layer disposed between the second barrier layer and the second buffer layer. The third and fourth barrier layers have dielectric constants lower than the dielectric constants of the first and second barrier layers.

According to an embodiment of the disclosure, a display device comprises a first base substrate, a first barrier layer, a second base substrate, a first sub-substrate, a second barrier layer, a second buffer layer, a first buffer layer, at least one transistor, and an organic light-emitting diode. The first barrier layer is disposed on the first base substrate. The second base substrate is disposed on the first barrier layer. The first sub-substrate is disposed on the second base substrate and comprises at least one dopant selected from a group consisting of: fluorine (F), boron (B), arsenic (As), phosphorus (P), chlorine (Cl), bromine (Br), iodine (I), astatine (At), sulfur (S), selenium (Se), argon (Ar), and tellurium (Te). The second barrier layer is disposed on the first sub-substrate. The second buffer layer is disposed on the second barrier layer. The first buffer layer is disposed on the second buffer layer. The at least one transistor is disposed on the first buffer layer. The organic light-emitting diode is disposed on the at least one transistor. The first sub-substrate is in contact with the second barrier layer. A dielectric constant and a specific resistance of each of the first sub-substrate and the second barrier layer satisfy the following relational expression:

$$\varepsilon_1 p_1 \neq \varepsilon_2 p_2$$

wherein $\varepsilon_1$ denotes the dielectric constant of the first sub-substrate, $p_1$ denotes the specific resistance of the first sub-substrate, $\varepsilon_2$ denotes the dielectric constant of the second barrier layer, and $p_2$ denotes the specific resistance of the second barrier layer.

In an embodiment, a value of $\varepsilon_1 p_1$ of the first sub-substrate is greater than a value $\varepsilon_2 p_2$ of the second barrier layer.

In an embodiment, the first sub-substrate has the dielectric constant of 2 to 3.8, and the second barrier layer has the dielectric constant of 5 or more.

BRIEF DESCRIPTION OF THE DRAWINGS

The above and other aspects and features of the present disclosure will become more apparent by describing in detail embodiments thereof with reference to the attached drawings.

DETAILED DESCRIPTION OF THE EMBODIMENTS

The inventive concept will now be described more fully hereinafter with reference to the accompanying drawings, in which embodiments are shown. The inventive concept may, however, be embodied in different forms and should not be construed as limited to the embodiments set forth herein. Rather, these embodiments are provided so that this disclosure will be thorough and complete, and will fully convey the scope of the inventive concept to those skilled in the art.

It will also be understood that when a layer is referred to as being "on" another layer or substrate, it can be directly on the other layer or substrate, or intervening layers may also be present. The same reference numbers indicate the same components throughout the specification.

It will be understood that, although the terms "first," "second," etc. may be used herein to describe various elements, these elements should not be limited by these terms. These terms are only used to distinguish one element from another element. For instance, a first element discussed below could be termed a second element without departing from the teachings of the inventive concept. Similarly, the second element could also be termed the first element.

Each of the features of the various embodiments of the present disclosure may be combined or combined with each other, in part or in whole, and technically various interlocking and driving are possible. Each embodiment may be implemented independently of each other or may be implemented together in an association.

Hereinafter, embodiments of the present disclosure will be described with reference to the accompanying drawings.

Figure 1:
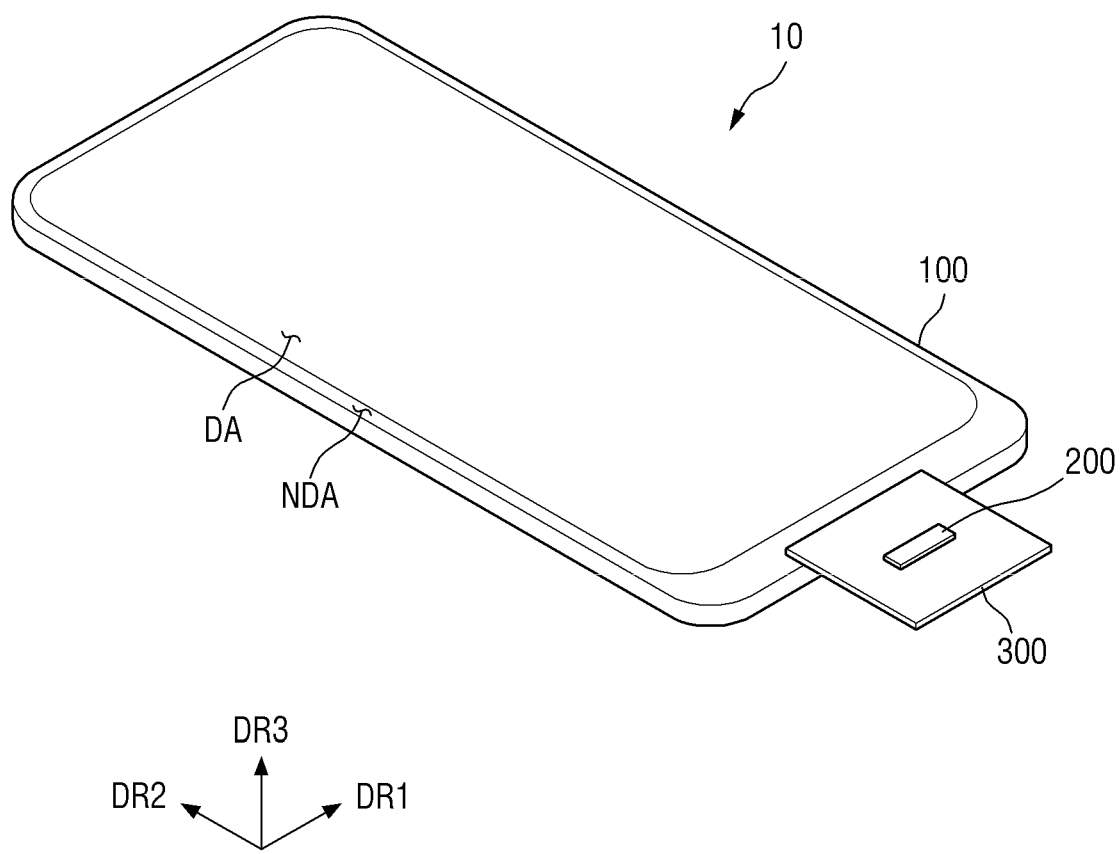
FIG. 1 is a perspective view of a display device according to an embodiment of the present disclosure.
Figure 2:
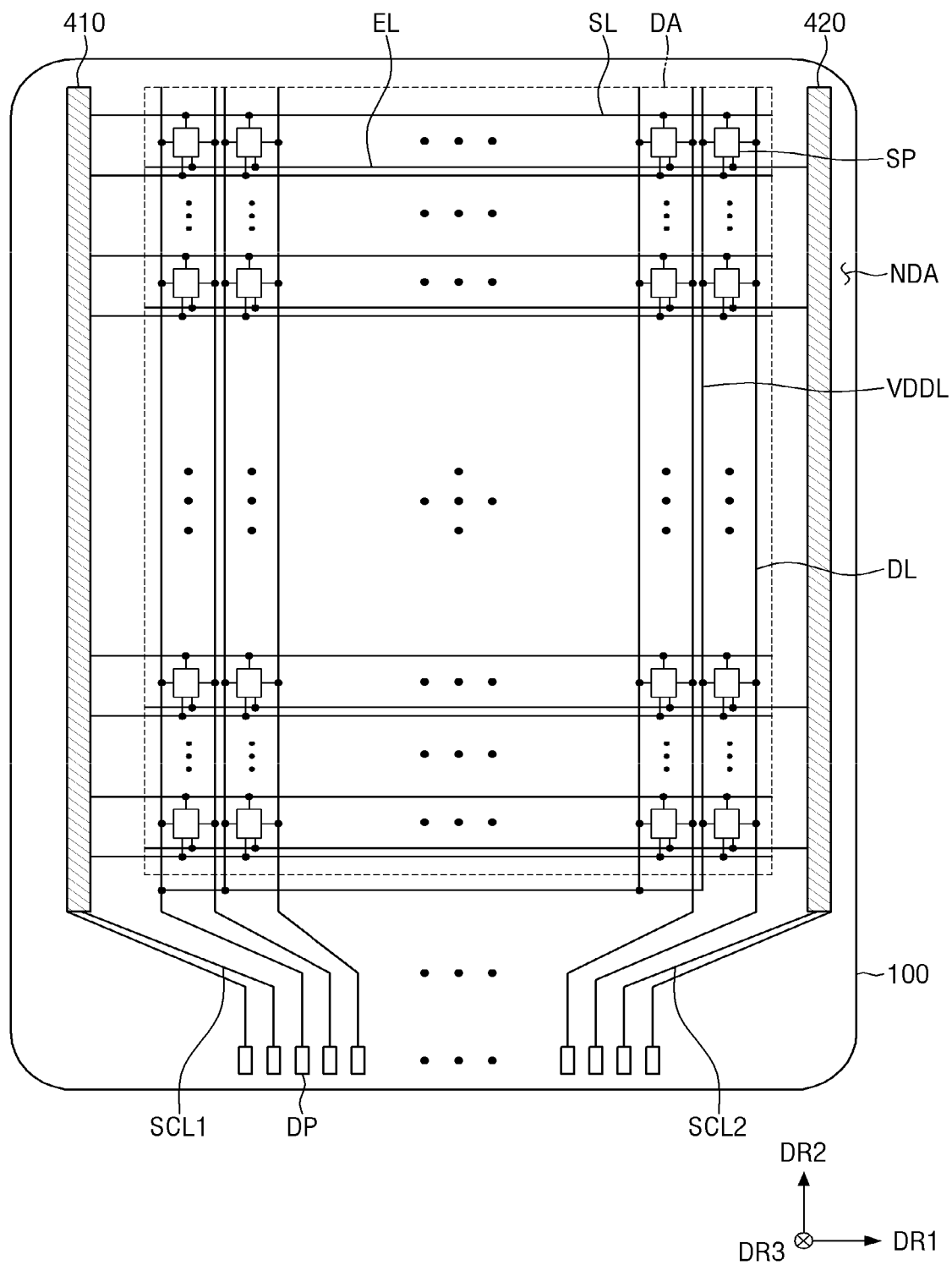
FIG. 2 is a plan view showing an example of a display panel according to an embodiment of the present disclosure.

FIG. 1 is a perspective view of a display device 10 according to an embodiment of the present disclosure. FIG. 2 is a plan view showing an example of a display panel 100 according to an embodiment of the present disclosure.

As used herein, the terms "above," "top" and "upper surface" refer to the upper side of the display panel 100, i.e., the side indicated by the arrow in a third direction DR3, whereas the terms "below," "bottom" and "lower surface" refer to the lower side of the display panel 100, i.e., the opposite side in the third direction DR3.

The display device 10 is for displaying moving images or still images. The display device 10 may be used as the display screen of portable electronic devices such as a mobile phone, a smart phone, a tablet PC, a smart watch, a watch phone, a mobile communications terminal, an electronic notebook, an electronic book, a portable multimedia player (PMP), a navigation device and an ultra-mobile PC (UMPC), as well as the display screen of various products such as a television, a notebook, a monitor, a billboard and the Internet of Things. The display device 10 may be one of an organic light-emitting display device, a liquid-crystal display device, a plasma display device, a field emission display device, an electrophoretic display device, an electrowetting display device, a quantum dot light-emitting display device, a micro LED display device and the like. In the following description, an organic light-emitting display device is described as an example of the display device 10.

Referring to FIGS. 1 and 2, the display device 10 according to an embodiment includes the display panel 100, a display driver 200, and a circuit board 300.

The display panel 100 may be formed in a rectangular plane having shorter sides in a first direction DR1 and longer sides in a second direction DR2 intersecting the first direction DR1. Each of the corners where the short side in the first direction DR1 meets the longer side in the second direction DR2 may be rounded with a predetermined curvature or may be a right angle. The shape of the display panel 100 when viewed from the top is a quadrangular shape, but may be formed in a different polygonal shape, a circular shape, or an elliptical shape. The display panel 100 may be formed to be flat. The display panel 10 may include curved portions formed at left and right ends of the display panel 10 and having a constant or varying curvature. In addition, the display panel 100 may be formed to be flexible so that it can be curved, bent, folded or rolled.

The display panel 100 may include a display area DA where sub-pixels SP are formed to display images, and a non-display area NDA which is the peripheral area of the display area DA. When the display panel 100 includes a curved portion, the display area DA may be disposed on the curved portion. In such case, images of the display panel 100 can also be seen on the curved portion.

In the display area DA, scan lines SL, emission lines EL, data lines DL and first supply voltage lines VDDL connected to the sub-pixels SP may be disposed, in addition to the sub-pixels SP. The scan lines SL and the emission lines EL may be arranged in the first direction DR1, while the data lines DL may be arranged in the second direction DR2 intersecting the first direction DR1. The first supply voltage lines VDDL may be arranged in parallel in the second direction DR2 in the display area DA. The first supply voltage lines VDDL formed in parallel in the second direction DR2 in the display area DA may be connected to one another in the non-display area NDA.

Each of the sub-pixels SP may be connected to at least one of the scan lines SL, at least one of the data lines DL, at least one of the emission lines EL, and at least one of the first supply voltage lines VDDL. In the example shown in FIG. 2, each of the sub-pixels SP is connected to two scan lines SL, one data line DL, one emission line EL, and the first supply voltage line VDDL for convenience of illustration. However, for example, each of the sub-pixels SP may be connected to three scan lines SL rather than two scan lines SL.

Each of the sub-pixels SP may include a driving transistor, at least one switching transistor, a light-emitting element, and a capacitor. When the data voltage is applied to a gate electrode, the driving transistor may supply a driving current to the light-emitting element, so that light can be emitted.

The driving transistor and the at least one switching transistor may be thin-film transistors (TFTs). The light-emitting element may emit light in proportion to the driving current from the driving transistor. The light-emitting element may be an organic light-emitting diode including an anode electrode, an organic light emitting layer, and a cathode electrode. The capacitor can keep the data voltage applied to the gate electrode of the driving transistor constant.

The non-display area NDA may be defined as the area from the outer side of the display area DA to the edge of the display panel 100. In the non-display area NDA, a scan driver 410 for applying scan signals to scan lines SL, and pads DP connected to the data lines DL may be disposed. Since the circuit board 300 is attached to the pads DP, the pads DP may be disposed on one edge of the display panel 100, e.g., the lower edge of the display panel 100.

The scan driver 410 may be connected to the display driver 200 through a plurality of first scan control lines SCL1. The scan driver 410 may receive scan control signals from the pads DP through the plurality of first scan control wires SCL1. The scan driver 410 may generate scan signals according to the scan control signals and may sequentially output the scan signals to the scan lines SL. The sub-pixels SP to which the data voltages are supplied are selected by the scan signals of the scan driver 410 and the data voltages are supplied to the selected sub-pixels SP.

An emission control driver 420 may be connected to a display driver 200 through a plurality of second scan control lines SCL2. The emission control driver 420 may receive emission control signals from the pads DP through the plurality of second scan control lines SCL2. The emission control driver 420 may generate emission control signals according to the emission control signals and may sequentially output the emission control signals to the emission lines EL.

The scan driver 410 is disposed on an outer side of the display area DA, and the emission control driver 420 is disposed on the opposite side of the display area DA in the example shown in FIG. 2. However, both the scan driver 410 and the emission control driver 420 may be disposed on an outer side of the display area DA or may be disposed on each of the outer sides of the display area DA.

The display driver 200 receives digital video data and timing signals from external devices. The display driver 200 converts the digital video data into analog positive/negative data voltages and supplies them to the data lines DL. The display driver 200 generates and supplies scan control signals for controlling the operation timing of the scan driver 410 through the first scan control lines SCL1. The display driver 200 generates and supplies emission control signals for controlling the operation timing of the emission control driver 420 through the second scan control lines SCL2. The display driver 200 may supply a first supply voltage to the first supply voltage lines VDDL.

The display driver 200 may be implemented as an integrated circuit (IC) and attached to the circuit board 300 by the chip-on-film (COF) technique. Alternatively, the display driver 200 may be attached to the display panel 100 by chip-on-glass (COG) technique, chip-on-plastic (COP) technique, or ultrasonic bonding.

The circuit board 300 may be attached to the pads DP using an anisotropic conductive film. In this manner, lead lines of the circuit board 300 may be electrically connected to the pads DP. The circuit board 300 may be a flexible printed circuit board, a printed circuit board, or a flexible film such as a chip on film.

Figure 3:
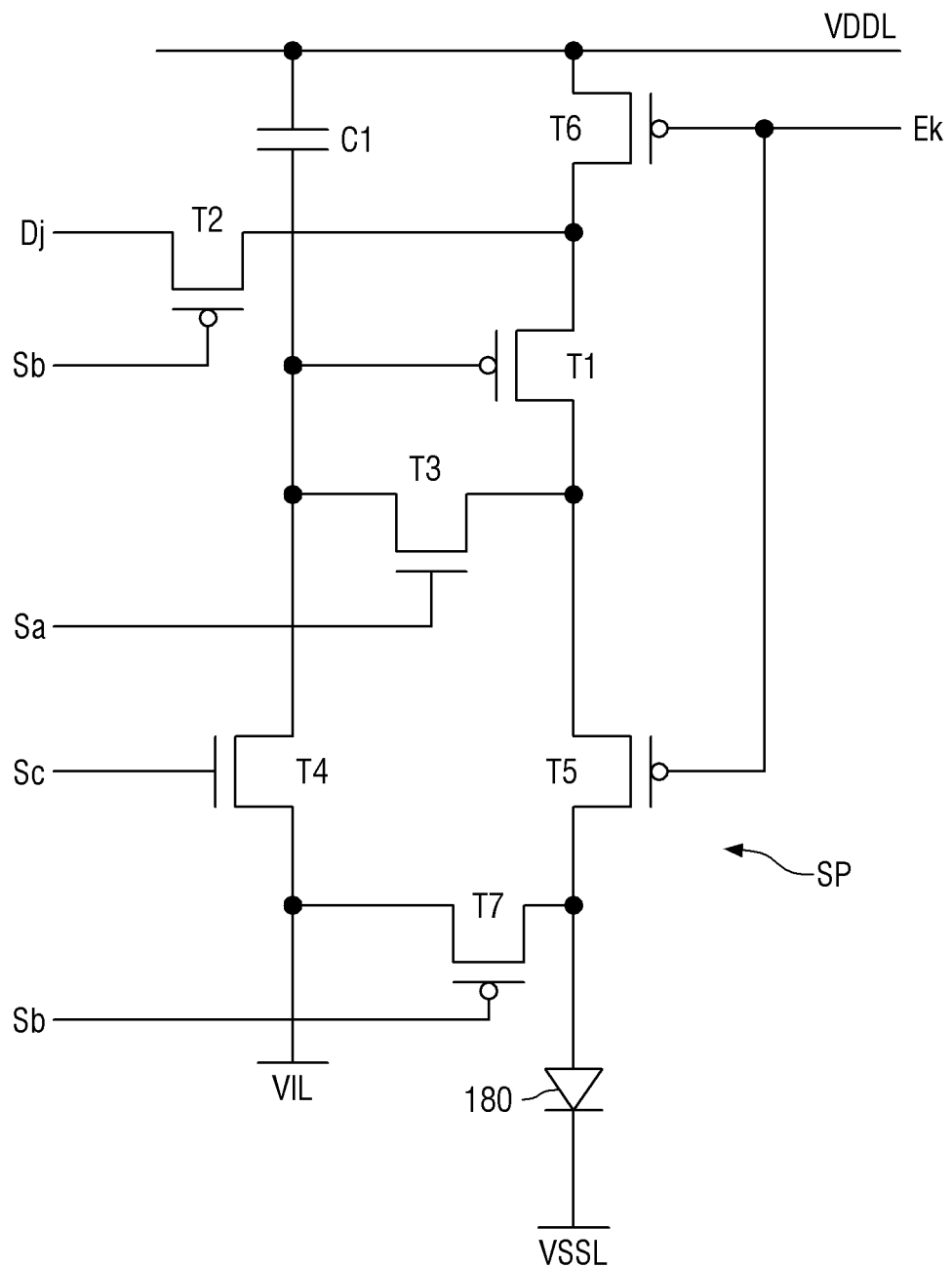
FIG. 3 is a circuit diagram showing an example of one of the sub-pixels of FIG. 2.

FIG. 3 is a circuit diagram showing an example of one of the sub-pixels SP of FIG. 2.

In FIG. 3, a circuit of the sub-pixel SP of the display device 10 may include an organic light-emitting diode 180, a plurality of transistors T1 to T7, and a capacitor C1. A data line Dj, a first scan line Sa, a second scan line Sb, a third scan line Sc, an emission line Ek, a first supply voltage line VDDL, a second supply voltage line VSSL, and an initializing voltage line VIL may be connected to the circuit of the sub-pixel SP.

The organic light-emitting diode 180 may include an anode electrode and a cathode electrode. The capacitor C1 may include a first electrode and a second electrode.

The plurality of transistors may include first to seventh transistors T1 to T7. Each of the transistors T1 to T7 may include a gate electrode, a first electrode, and a second electrode. One of the first electrode and the second electrode of each of the transistors T1 to T7 may be a source electrode while the other one may be a drain electrode.

Each of the transistors T1 to T7 may be a thin-film transistor. Each of the transistors T1 to T7 may be either a PMOS transistor or an NMOS transistor. In an embodiment, the first transistor T1 as a driving transistor, the second transistor T2 as a data transfer transistor, the fifth transistor T5 as a first emission control transistor, the sixth transistor T6 as a second emission control transistor and the seventh transistor T7 as a second initializing transistor are PMOS transistors. On the other hand, the third transistor T3 as a compensating transistor, and the fourth transistor T4 as a first initializing transistor are NMOS transistors. The PMOS transistors and the NMOS transistors have different characteristics. The third transistor T3 and the fourth transistor T4 are implemented with NMOS transistors having a relatively good turn-off characteristic so that leakage of the driving current during the emission period of the organic light-emitting diode OLED can be reduced.

Hereinafter, each of the elements will be described in detail.

The gate electrode of the first transistor T1 is connected to the first electrode of the capacitor C1. The first electrode of the first transistor T1 is connected to the terminal of the first supply voltage VDDL via the sixth transistor T6. The second electrode of the first transistor T1 is connected to the anode electrode of the organic light-emitting diode 180 via the fifth transistor T5. The first transistor T1 receives a data signal according to the switching operation of the second transistor T2 to supply the driving current to the organic light-emitting diode 180.

The gate electrode of the second transistor T2 is connected to the terminal of the second scan line Sb. The first electrode of the second transistor T2 is connected to the terminal of the data line Dj. The second electrode of the second transistor T2 is connected to the first electrode of the first transistor T1 and is connected to the terminal of the first supply voltage VDDL through the sixth transistor T6. The second transistor T2 performs switching operation in such a manner that it is turned on in response to a signal applied to the second scan line Sb to transfer a data signal applied through a data line Dj to the first electrode of the first transistor T1.

The gate electrode of the third transistor T3 is connected to the terminal of the first scan line Sa. The first electrode of the third transistor T3 is connected to the second electrode of the first transistor T1 and is connected to the anode electrode of the organic light-emitting diode 180 via the fifth transistor T5. The second electrode of the third transistor T3 is connected to the first electrode of the capacitor C1, the first electrode of the fourth transistor T4 and the gate electrode of the first transistor T1. The third transistor T3 is turned on in response to the signal of the first scan line Sa to connect the gate electrode with the second electrode of the first transistor T1, to diode-connect the first transistor T1. Accordingly, a voltage difference equal to the threshold voltage of the first transistor T1 is generated between the first electrode and the gate electrode of the first transistor T1. Deviations in the threshold voltage of the first transistor T1 can be compensated by supplying the data signal that compensates for the threshold voltage to the gate electrode of the first transistor T1.

The gate electrode of the fourth transistor T4 is connected to the terminal of the third scan line Sc. The second electrode of the fourth transistor T4 is connected to the terminal of the initializing voltage line VIL. The first electrode of the fourth transistor T4 is connected to the first electrode of the capacitor C1, the second electrode of the third transistor T3 and the gate electrode of the first transistor T1. The fourth transistor T4 is turned on in response to the signal of the third scan line Sc to transfer the initializing voltage signal of the initializing voltage line VIL to the gate electrode of the first transistor T1, to initialize the voltage at the gate electrode of the first transistor T1.

The gate electrode of the fifth transistor T5 is connected to the terminal of the emission line Ek. The first electrode of the fifth transistor T5 is connected to the second electrode of the first transistor T1 and the first electrode of the third transistor T3. The second electrode of the fifth transistor T5 is connected to the anode electrode of the organic light-emitting diode 180.

The gate electrode of the sixth transistor T6 is connected to the terminal of the emission line Ek. The first electrode of the sixth transistor T6 is connected to the terminal of the first supply voltage VDDL. The second electrode of the sixth transistor T6 is connected to the first electrode of the first transistor T1 and the second electrode of the second transistor T2.

The fifth transistor T5 and the sixth transistor T6 are simultaneously turned on in response to the emission control signal of the emission line Ek so that the driving current flows through the organic light-emitting diode 180.

The gate electrode of the seventh transistor T7 is connected to the terminal of the second scan line Sb. The first electrode of the seventh transistor T7 is connected to the anode electrode of the organic light-emitting diode 180. The second electrode of the seventh transistor T7 is connected to the terminal of the initializing voltage VIL. The seventh transistor T7 is turned on in response to the emission control signal of the emission line Ek to initialize the anode electrode of the organic light-emitting diode 180.

Although the signal of the second scan line Sb is applied to the gate electrode of the seventh transistor T7 in this embodiment of the present disclosure, the pixel circuit may be configured such that the emission control signal of the emission line Ek may be applied to the gate electrode of the seventh transistor T7 in an embodiment.

The second electrode of the capacitor C1 is connected to the terminal of the first supply voltage line VDDL. The first electrode of the capacitor C1 is connected to the gate electrode of the first transistor T1, the second electrode of the third transistor T3 and the first electrode of the fourth transistor T4. The cathode electrode of the organic light-emitting diode 180 is connected to the terminal of the second supply voltage line VSSL. The organic light-emitting diode 180 displays an image by receiving a driving current from the first transistor T1 to emit light.

Each of the first to seventh transistors T1, T2, T3, T4, T5, T6 and T7 may include a semiconductor layer. Some of the first to seventh transistors T1, T2, T3, T4, T5, T6 and T7 may include a semiconductor layer made of polycrystalline silicon, while some others of the first to seventh transistors T1, T2, T3, T4, T5, T6 and T7 may include a semiconductor layer made of oxide. For example, the semiconductor layers of the first to seventh transistors T1, T2, T3, T4, T5, T6 and T7 may be made of polycrystalline silicon. Alternatively, the semiconductor layers of the first transistor T1, the fifth transistor T5 to the seventh transistor T7 may be made of polycrystalline silicon while the semiconductor layers of the third transistor T3 and the fourth transistor T4 may be made of oxide. For example, the semiconductor layer of the driving transistor may include polycrystalline silicon, and the semiconductor layer of the switching transistor may include oxide.

The semiconductor layer of the switching transistor may include a first channel region overlapping the gate electrode of the switching transistor, a first drain region located on one side of the first channel region, and a first source region located on the other side of the first channel region. The semiconductor layer of the driving transistor may include a second channel region overlapping the gate electrode of the driving transistor, a second drain region located on one side of the second channel region, and a second source region located on the other side of the second channel region.

The above-described display device 10 may include a flexible material such as plastic in order to implement the display device 10 that can be curved or bent. As an example, the substrate may include polyimide. Polyimide may be used for a substrate for a variety of flexible display devices as a flexible insulating substrate. Unfortunately, for such a substrate including polyimide, charging phenomenon may occur, i.e., electrons may be collected on the surface. Electrical characteristics of a thin-film transistor adjacent to the substrate may be deteriorated due to such electron charging.

Hereinafter, a display device that can prevent characteristics of thin-film transistors from being deteriorated by way of improving the issue of electron charging in the substrate is presented.

Figure 4:
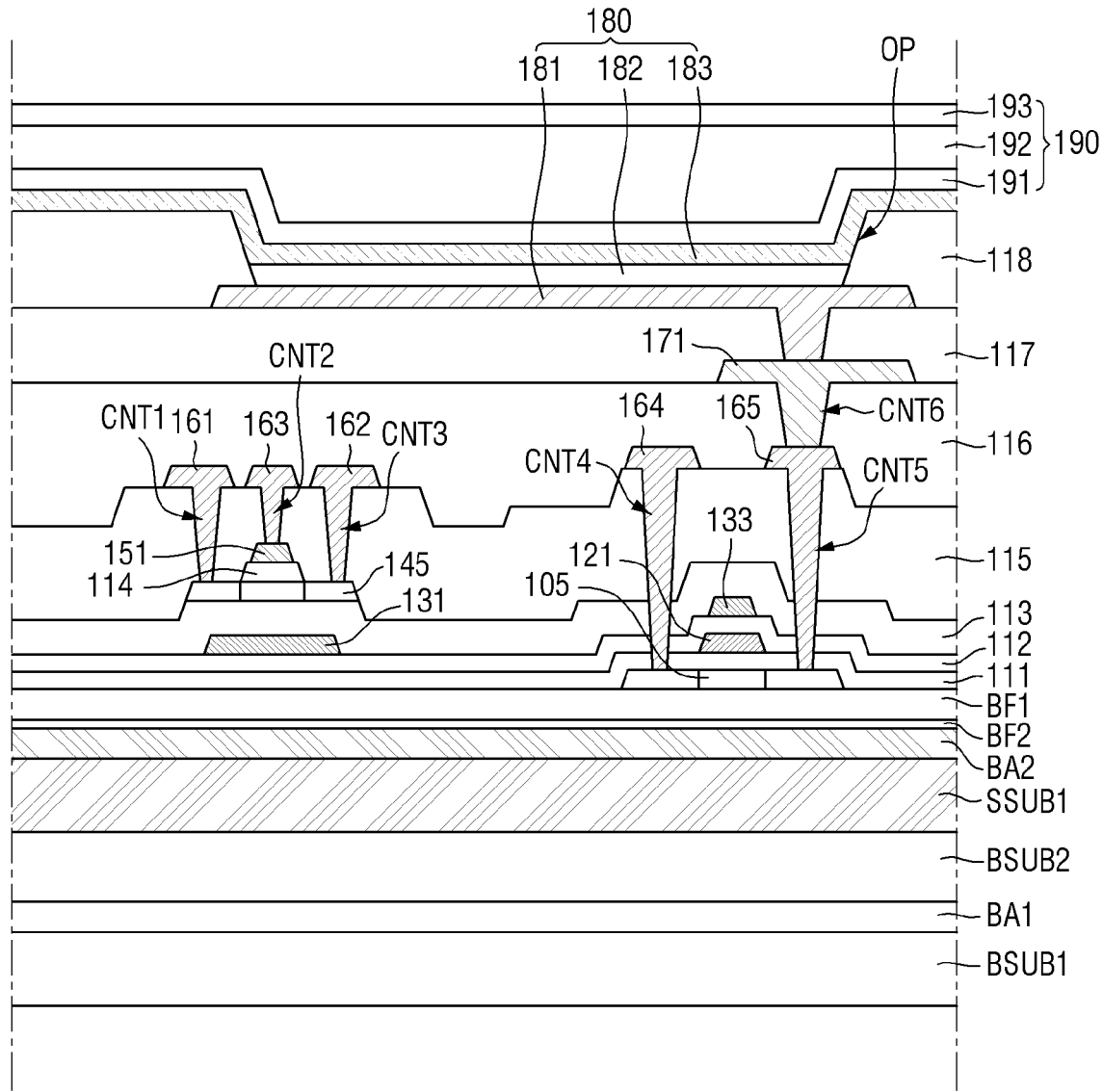
FIG. 4 is a cross-sectional view showing a display device according to an embodiment of the present disclosure.
Figure 5:
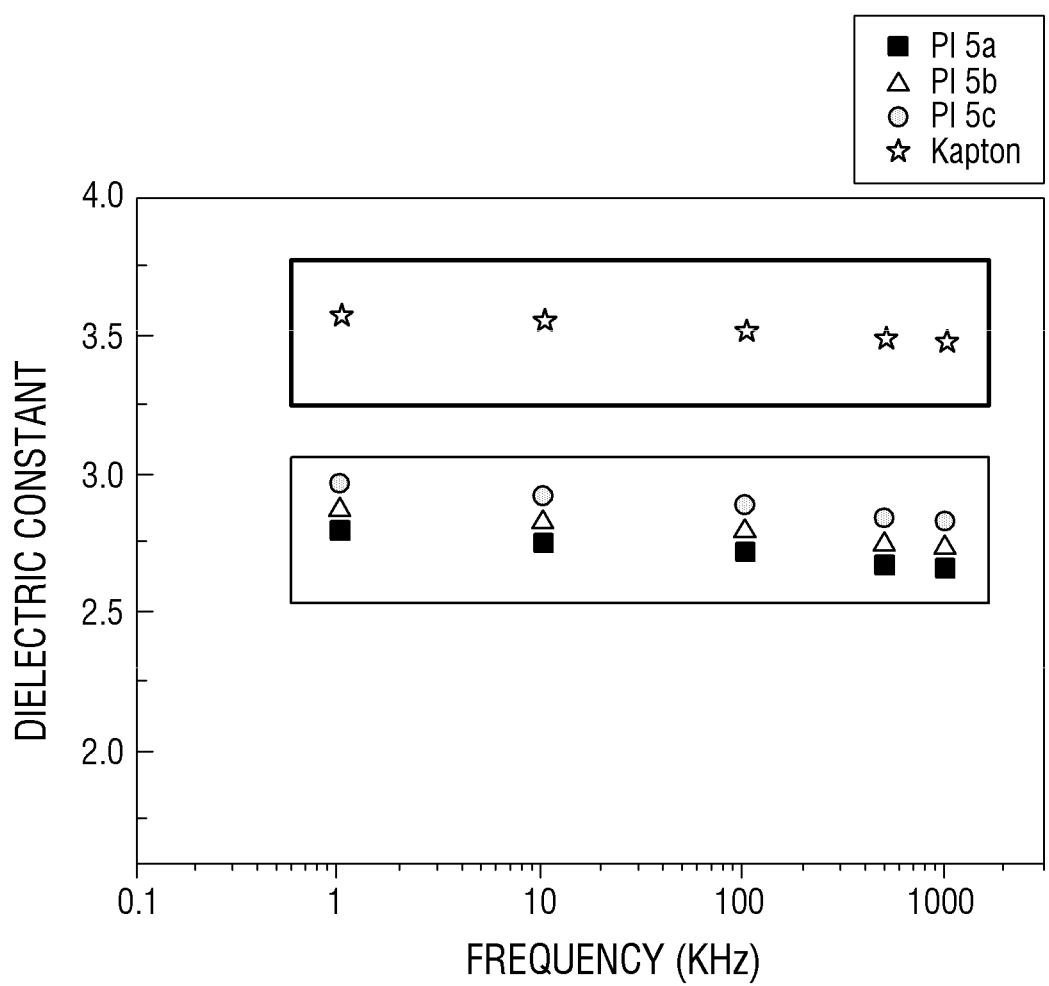
FIG. 5 is a graph showing the dielectric constants of polyimide thin films containing fluorine and a polyimide thin film containing no fluorine.
Figure 6:
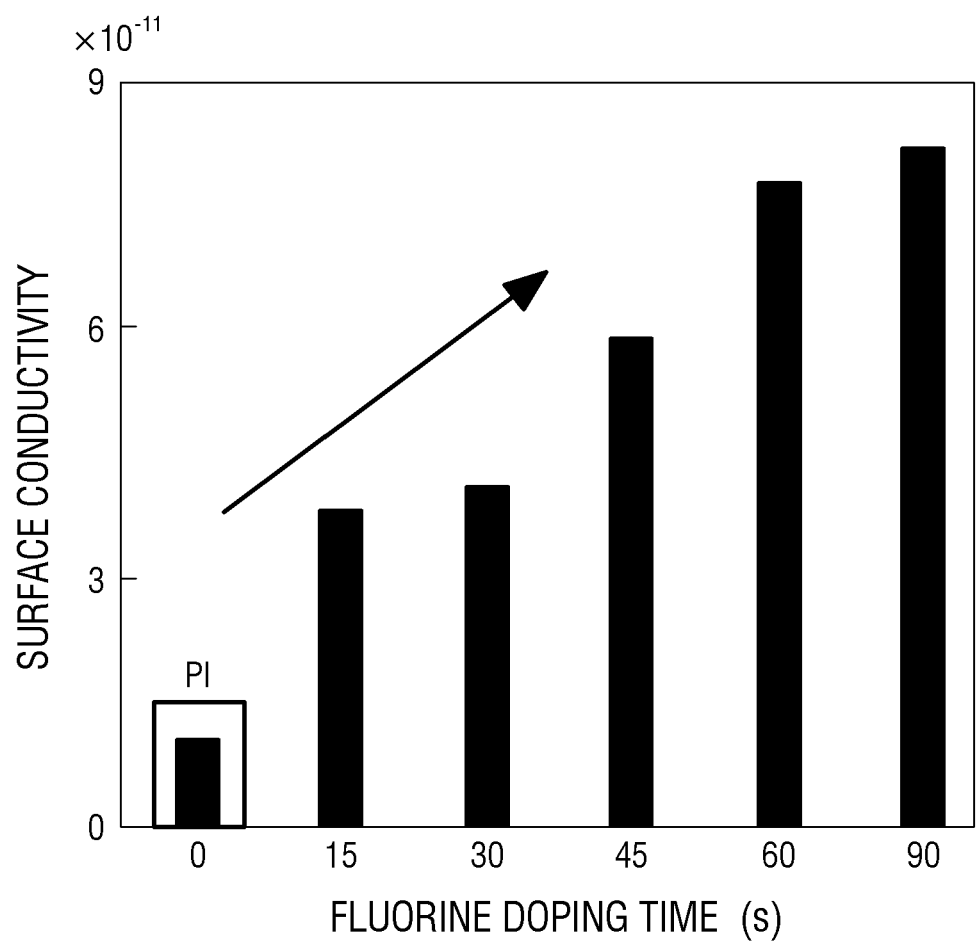
FIG. 6 is a graph showing the surface conductivity of a polyimide thin film versus time for doping fluorine.
Figure 7:
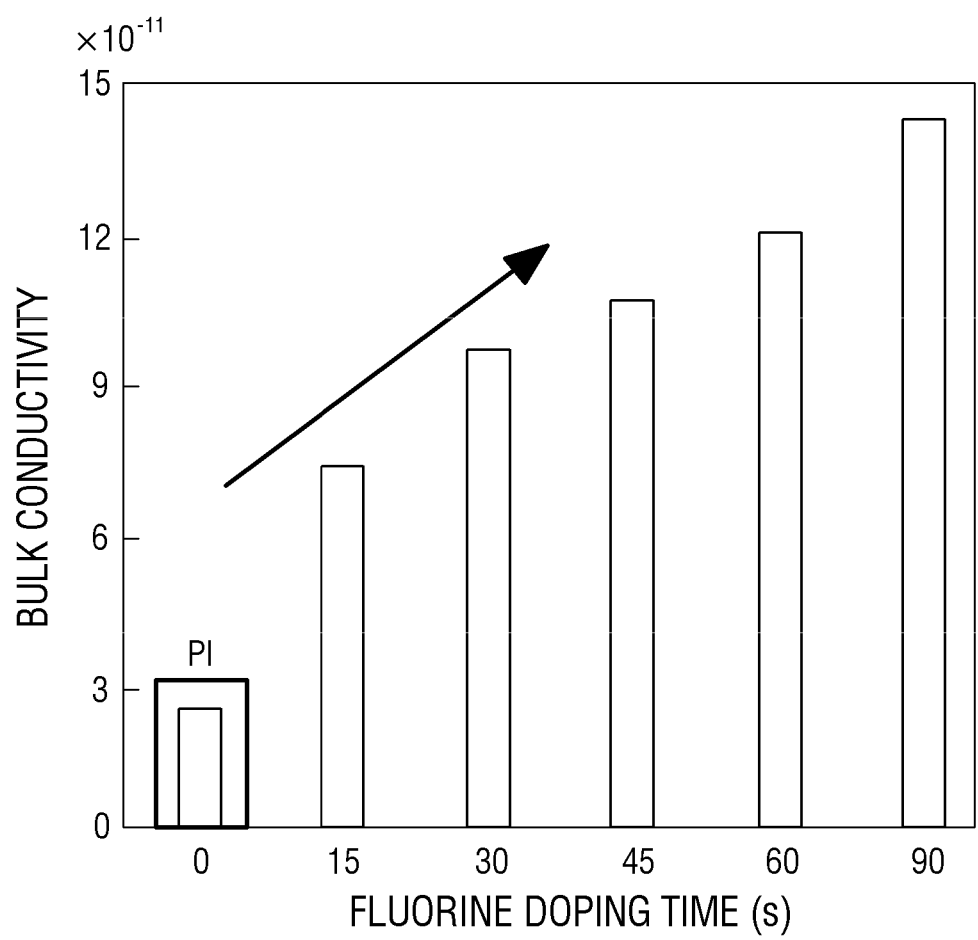
FIG. 7 is a graph showing the bulk conductivity of a polyimide thin film versus time for doping.
Figure 8:
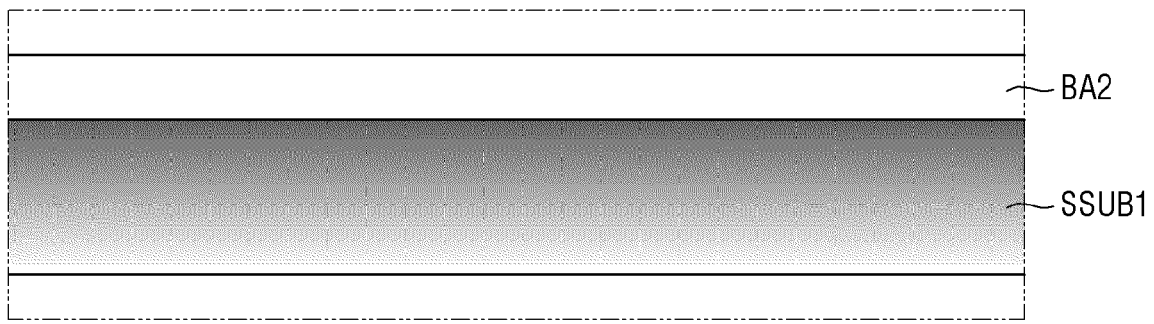
FIG. 8 is an enlarged cross-sectional view showing a second barrier layer and a first sub-substrate.
Figure 9:
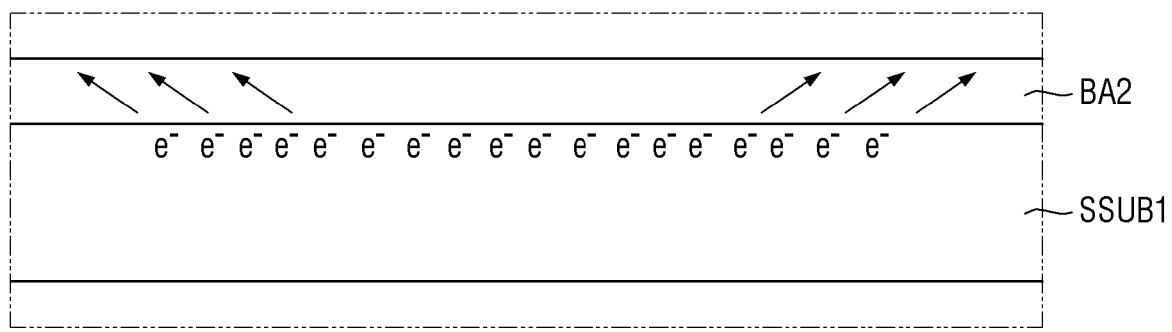
FIG. 9 is a schematic view showing the second barrier layer and the first sub-substrate.

FIG. 4 is a cross-sectional view showing the display device 10 according to an embodiment of the present disclosure. FIG. 5 is a graph showing the dielectric constants of polyimide thin films containing fluorine and a polyimide thin film containing no fluorine. FIG. 6 is a graph showing the surface conductivity of a polyimide thin film versus time for doping fluorine. FIG. 7 is a graph showing the bulk conductivity of a polyimide thin film versus time for doping. FIG. 8 is an enlarged cross-sectional view showing a second barrier layer and a first sub-substrate. FIG. 9 is a schematic view showing the second barrier layer and the first sub-substrate.

Referring to FIG. 4, the display device 10 according to an embodiment may include a first barrier layer BA1 disposed on a first base substrate BSUB1, a second base substrate BSUB2 disposed on a second barrier layer BA2, a first sub-substrate SSUB1 disposed on the second base substrate BSUB2, the second barrier layer BA2 disposed on the first sub-substrate SSUB1, a second buffer layer BF2 disposed on the second barrier layer BA2, a first buffer layer BF1 disposed on the second buffer layer BF2, a switching transistor ST disposed on the first buffer layer BF1, a driving transistor DT, and the organic light-emitting diode 180.

Specifically, the first base substrate BSUB1 supports the layers disposed on the first base substrate BSUB1. The first base substrate BSUB1 may be used when the organic light-emitting display device is of a bottom-emission or both-sided emission type. When the organic light-emitting display device is of a top-emission type, a semitransparent or opaque substrate as well as a transparent substrate may be employed. The first base substrate BSUB1 may include a flexible material such as plastic, and may be, for example, polyimide.

The first barrier layer BA1 may be disposed on the first base substrate BSUB1. The first barrier layer BA1 can prevent impurity ions from diffusing, can prevent permeation of moisture or outside air, and can provide a flat surface. The first barrier layer BA1 may include silicon nitride, silicon oxide, silicon oxynitride, or the like.

The second base substrate BSUB2 may be disposed on the first barrier layer BA1. The second base substrate BSUB2 may include a flexible material such as plastic, and may be, for example, polyimide.

The first sub-substrate SSUB1 may be disposed on the second base substrate BSUB2. The first sub-substrate SSUB1 may be an insulating substrate disposed closest to the thin-film transistors described below. When a voltage is applied to the gate electrode of each of the thin-film transistors, electrons are charged at the interface between the first sub-substrate SSUB1 and the second barrier layer BA2 disposed on the first sub-substrate SSUB1, and interfacial polarization may occur. When this happens, the electrons may be combined with the residual DC components existing in the drain signal of the thin-film transistors, such that the electrons may not bypass even after a period of time has elapsed. As a result, an afterimage is created, i.e., a specific pattern remains. Such afterimage does not disappear quickly even after stress is applied to a specific image, and thus it may cause the quality of the screen to deteriorate.

According to this embodiment, by forming the first sub-substrate SSUB1 having a dielectric constant of 2 to 3.8, it is possible to reduce electron charging and suppress interfacial polarization.

A condition that causes interfacial polarization at the interface between the first sub-substrate SSUB1 and the second barrier layer BA2 may be expressed by the following relationship:

$$\varepsilon_1 p_1 \neq \varepsilon_2 p_2 \quad \text{[Relational Expression]}$$

where $\varepsilon_1$ denotes the dielectric constant of the first sub-substrate SSUB1, $p_1$ denotes the specific resistance of the first sub-substrate SSUB1, $\varepsilon_2$ denotes the dielectric constant of the second barrier layer BA2, and $p_2$ denotes the specific resistance of the second barrier layer BA2.

Referring to the above relational expression, interfacial polarization is caused if the value of $\varepsilon_1 p_1$ is not equal to the value of $\varepsilon_2 p_2$. On the contrary, if the values of $\varepsilon_1 p_1$ is equal to $\varepsilon_2 p_2$, interfacial polarization does not occur. The interfacial polarization gradually decreases as the difference between the values of $\varepsilon_1 p_1$ and $\varepsilon_2 p_2$ decreases. For example, the first sub-substrate SSUB1 made of polyimide may have a dielectric constant of approximately 3.4 and a specific resistance of approximately $10^{17}$ Ωcm. The second barrier layer BA2 made of silicon oxide may have a dielectric constant of approximately 3.9 and a specific resistance of about $10^{14}$ to $10^{16}$ Ωcm. Substituting the values into the above relational expression, the value of $\varepsilon_1 p_1$ of the first sub-substrate SSUB1 may be greater than the value of $\varepsilon_2 p_2$ of the second barrier layer BA2. According to this embodiment, by lowering the dielectric constant of the first sub-substrate SSUB1 to reduce the difference between the value of $\varepsilon_1 p_1$ of the first sub-substrate SSUB1 and the value of $\varepsilon_2 p_2$ of the second barrier layer BA2, it is possible to suppress the interfacial polarization. In some implementations, the value of $\varepsilon_1 p_1$ of the first sub-substrate SSUB1 may be smaller than the value of $\varepsilon_2 p_2$ of the second barrier layer BA2.

According to an embodiment of the present disclosure, the dielectric constant of the first sub-substrate SSUB1 may be smaller than the dielectric constant of the second barrier layer BA2. To lower the dielectric constant of the first sub-substrate SSUB1, the first sub-substrate SSUB1 may include at least one dopant selected from the group consisting of: fluorine (F), boron (B), arsenic (As), phosphorus (P), chlorine (Cl), bromine (Br), iodine (I), astatine (At), sulfur (S), selenium (Se), and tellurium (Te).

FIG. 5 shows dielectric constants of polyimide thin films doped with fluorine, which is one of the dopants, and polyimide thin films not doped with fluorine versus measurement frequency. The polyimide thin film not doped with fluorine, labeled Kapton, has a dielectric constant of approximately 3.5 in the frequency range of 1 to 1,000 KHz. On the other hand, polyimide thin films PI 5a, PI 5b and PI 5c doped with fluorine exhibited dielectric constants of approximately 2.5 to 3. It can be seen from the above that the dielectric constants of the polyimide thin films containing fluorine were lowered. Accordingly, according to this embodiment, the first sub-substrate SSUB1 may contain fluorine to reduce the dielectric constant. In some embodiments, the first sub-substrate SSUB1 may contain at least one dopant selected from the group consisting of: boron (B), arsenic (As), phosphorus (P), chlorine (Cl), bromine (Br), iodine (I), astatine (At), sulfur (S), selenium (Se), and tellurium (Te), in addition to fluorine.

For example, according to this embodiment, fluorine may be included in the first sub-substrate SSUB1 to increase the conductivity of the first sub-substrate SSUB1. When the conductivity of the first sub-substrate SSUB1 increases, electrons charged in the first sub-substrate SSUB1 can be easily discharged, and the electric field of the transistor can be controlled.

Referring to FIGS. 6 and 7, the graphs show the surface conductivity and bulk conductivity of a polyimide thin film over the time for doping fluorine into the polyimide thin film. The surface conductivity was measured at one point and another point on the surface of the polyimide thin film, and the bulk conductivity was measured at one point on the upper surface and another point on the lower surface of the polyimide thin film.

As shown in FIGS. 6 and 7, the surface conductivity and bulk conductivity of the polyimide thin film increase as the time for doping fluorine into the polyimide thin film increases. It can be seen from the above that the conductivity of the polyimide thin film was improved as it contains fluorine. According to this embodiment, by including at least one dopant selected from the group consisting of: fluorine (F), boron (B), arsenic (As), phosphorus (P), chlorine (Cl), bromine (Br), iodine (I), astatine (At), sulfur (S), selenium (Se) and tellurium (Te) in the first sub-substrate SSUB1, it is possible to reduce the electron charging by increasing the conductivity of the first sub-substrate SSUB1.

According to an embodiment, at least one dopant selected from the group consisting of: fluorine (F), boron (B), arsenic (As), phosphorus (P), chlorine (Cl), bromine (Br), iodine (I), astatine (At), sulfur (S), selenium (Se) and tellurium (Te) may be included in the first sub-substrate SSUB1 by using a synthesis method or a surface treatment method.

Initially, a method of including fluorine in the first sub-substrate SSUB1 using the synthesis method is as follows:

The synthesis of polyimide may be carried out by putting a dianhydride monomer and a diamine monomer in a solvent, performing condensation polymerization in the solvent to produce polyamic acid, which is a polyamide having a carboxyl group, and performing imidization (dehydration reaction) the obtained polyamic acid at high temperature to produce polyimide, as expressed in Reaction Formula below:

according to the synthesis method, since the dopants may be uniformly distributed over the entire first sub-substrate SSUB1, the concentration of the dopants may be uniform over the entire first sub-substrate SSUB1.

A method of including fluorine in the first sub-substrate SSUB1 using the surface treatment method may be one of

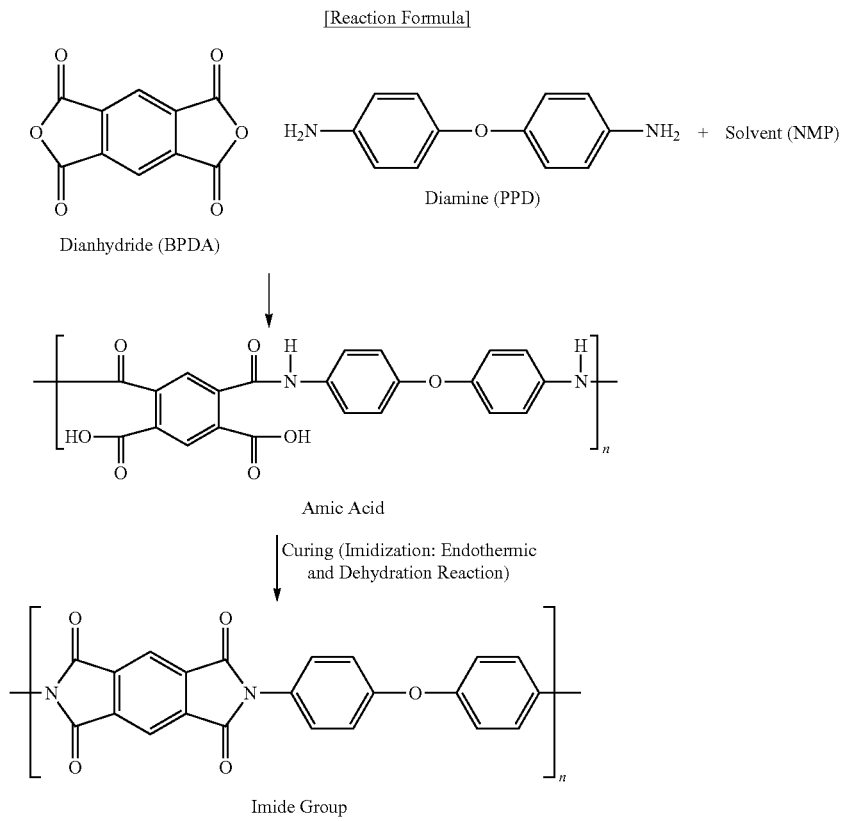

According to an embodiment of the present disclosure, polyimide can be produced by synthesizing a polyimide using a dianhydride monomer containing fluorine or a diamine monomer containing fluorine. After the polyamic acid is produced, a porogen compound may be mixed.

Examples of the dianhydride monomer containing fluorine may include 1,1,1,3,3,3-hexafluoro-2,2-bis(3,4-dicarboxyphenyl)propane dianhydride. Examples of the diamine monomer containing fluorine may include 2-fluoro-1,4-benzenediamine, 2,2-bis(4-aminophenyl)hexafluoropropane, and 2,2-bis[4-(4-aminophenoxy)phenyl]hexafluoropropane.

In some other embodiments, a dianhydride monomer, a diamine monomer, and a fluorine-containing compound may be put into a solvent, and may be synthesized to produce a polyimide. The fluorine-containing compound may include, for example, a compound having a functional group of R—$CF_3$. In some other embodiments, after preparing the polyamic acid, a compound containing fluorine may be added to prepare a polyimide.

Although fluorine is included in the above-described synthesis method as an example, at least one dopant selected from the group consisting of: boron (B), arsenic (As), phosphorus (P), chlorine (Cl), bromine (Br), iodine (I), astatine (At), sulfur (S), selenium (Se) and tellurium (Te) may also be included in the same manner. In addition, gas surface treatment, plasma treatment and ion implantation. For example, the gas surface treatment may be carried out by injecting $N_2$ and $F_2$ gas or $BF_3$ gas to a substrate on which a thin film is formed at a temperature of approximately 55° C., to implant fluorine or boron into the first sub-substrate SSUB1. The plasma treatment may be carried out by using a $CF_4$ or $SF_6$ gas containing fluorine or a $BF_3$ gas containing boron on the substrate on which the first sub-substrate SSUB1 is formed. The ion implantation may be carried out by implanting ions using BF3 gas and activating them using a laser.

Referring to FIG. 8, since the above-described surface treatment method injects the dopants at the surface of the first sub-substrate SSUB1, a concentration gradient may occur in the first sub-substrate SSUB1. According to an embodiment of the present disclosure, the concentration of the dopants may decrease in the first sub-substrate SSUB1 from the upper surface in contact with the second barrier layer BA2 to the lower surface. However, the concentration of the dopant may be largest inside the first sub-substrate SSUB1 than the upper and lower surfaces of the first sub-substrate SSUB1 depending on the dopant implantation process.

The second barrier layer BA2 in contact with the first sub-substrate SSUB1 may be disposed. As described above, the second barrier layer BA2 forms the interface in contact with the first sub-substrate SSUB1, and electron charging and interfacial polarization may occur at the interface between the first sub-substrate SSUB1 and the second barrier layer BA2.

According to this embodiment, the dielectric constant of the second barrier layer BA2 may be increased to suppress electron charging and interfacial polarization. As described above with reference to the relational expression, the value of $\varepsilon_1 p_1$ of the first sub-substrate SSUB1 may be greater than the value of $\varepsilon_2 p_2$ of the second barrier layer BA2. Accordingly, according to this embodiment, in addition to lowering the dielectric constant of the first sub-substrate SSUB1, the dielectric constant of the second barrier layer BA2 may be increased in order to increase the value of $\varepsilon_2 p_2$ of the second barrier layer BA2. Accordingly, the interfacial polarization can be suppressed by reducing a difference between the value of $\varepsilon_1 p_1$ of the first sub-substrate SSUB1 and the value of $\varepsilon_2 p_2$ of the second barrier layer BA2.

According to an embodiment of the present disclosure, in order to increase the dielectric constant of the second barrier layer BA2, the second barrier layer BA2 may be formed of a material having a high dielectric constant. The second barrier layer BA2 may include one selected from the group consisting of: silicon oxynitride (SiON), silicon nitride (SiNx), aluminum oxide ($Al_2O_3$), zirconium oxide ($ZrO_2$), hafnium oxide ($HfO_2$), titanium oxide ($TiO_2$), and tantalum oxide ($TaO_2$). The second barrier layer BA2 may be made up of a single layer or multiple layers of different materials stacked on one another.

When the dielectric constant of the second barrier layer BA2 is increased, the specific resistance may decrease. Since the specific resistance and conductivity are inversely proportional to each other, the conductivity may increase as the specific resistance of the second barrier layer BA2 decreases. For example, silicon nitride and aluminum oxide each have a specific resistance of approximately $10^{14}$ Ωcm or less, and zirconium oxide has a specific resistance of approximately $10^7$ to $10^{10}$ Ωcm.

As shown in FIG. 9, as the conductivity of the second barrier layer BA2 increases, the electrons charged at the interface with the first sub-substrate SSUB1 can be dispersed. Accordingly, according to this embodiment, by increasing the conductivity by increasing the dielectric constant of the second barrier layer BA2, electron charging can be reduced.

The second buffer layer BF2 may be disposed on the second barrier layer BA2. The second buffer layer BF2 serves to supply hydrogen to a polysilicon semiconductor layer 105, sometimes called the polycrystalline silicon semiconductor layer 105, to be described later. The second buffer layer BF2 may include silicon nitride, silicon oxide, silicon oxynitride, etc., and suitably may include silicon nitride.

The first buffer layer BF1 may be disposed on the second buffer layer BF2. The first buffer layer BF1 may include silicon nitride, silicon oxide, silicon oxynitride, or the like.

The polycrystalline silicon semiconductor layer 105 may be disposed on the buffer layer BF1. The polycrystalline silicon semiconductor layer 105 may be made of amorphous silicon or poly silicon. The crystalline silicon may be produced by crystallizing amorphous silicon. Examples of the crystallizing techniques may include rapid thermal annealing (RTA), solid phase crystallization (SPC), excimer laser annealing (ELA), metal induced crystallization (MIC), metal induced lateral crystallization (MILC), sequential lateral solidification (SLS), etc.

The polycrystalline silicon semiconductor layer 105 may include a second channel region overlapping a second gate electrode 121 in the thickness direction, i.e., the third direction DR3, a second drain region located on one side of the second channel region, and a second source region located on the other side of the second channel region.

A lower gate insulating layer 111 may be disposed on the polycrystalline silicon semiconductor layer 105. The lower gate insulating layer 111 may be a gate insulating film having a gate insulating function. The lower gate insulating layer 111 may include a silicon compound, a metal oxide, etc. For example, the lower gate insulating layer 111 may include silicon oxide, silicon nitride, silicon oxynitride, aluminum oxide, tantalum oxide, hafnium oxide, zirconium oxide, titanium oxide, etc. They may be used alone or in combinations. The lower gate insulating layer 111 may be made up of a single layer or multiple layers of different materials stacked on one another.

A first conductive layer 120 may be disposed on the lower gate insulating layer 111. The first conductive layer 120 may include the second gate electrode 121. The first conductive layer 120 may include at least one metal selected from the group consisting of: molybdenum (Mo), aluminum (Al), platinum (Pt), palladium (Pd), silver (Ag), magnesium (Mg), gold (Au), nickel (Ni), neodymium (Nd), iridium (Ir), chromium (Cr), calcium (Ca), titanium (Ti), tantalum (Ta), tungsten (W) and copper (Cu). The first conductive layer 120 may be made up of a single layer or multiple layers.

An upper gate insulating layer 112 may be disposed on the first conductive layer 120 including the second gate electrode 121. The upper gate insulating layer 112 may be a gate insulating film having a gate insulating function. The upper gate insulating layer 112 may include a silicon compound, a metal oxide, etc. For example, the upper gate insulating layer 112 may include silicon oxide, silicon nitride, silicon oxynitride, aluminum oxide, tantalum oxide, hafnium oxide, zirconium oxide, titanium oxide, etc. They may be used alone or in combinations. The upper gate insulating layer 112 may be made up of a single layer or multiple layers of different materials stacked on one another.

A second conductive layer 130 may be disposed on the upper gate insulating layer 112. The second conductive layer 130 may include at least one metal selected from the group consisting of: molybdenum (Mo), aluminum (Al), platinum (Pt), palladium (Pd), silver (Ag), magnesium (Mg), gold (Au), nickel (Ni), neodymium (Nd), iridium (Ir), chromium (Cr), calcium (Ca), titanium (Ti), tantalum (Ta), tungsten (W) and copper (Cu). The second conductive layer 130 may be made up of a single layer or multiple layers.

The second conductive layer 130 may include a first lower gate electrode 131 and a capacitor electrode 133. The first lower gate electrode 131 may be disposed to overlap with the first channel region of an oxide semiconductor layer 145 in the thickness direction. The capacitor electrode 133 may be disposed to overlap with the second channel region of the polycrystalline silicon semiconductor layer 105 in the thickness direction.

A lower interlayer dielectric layer 113 may be disposed on the second conductive layer 130. The lower interlayer dielectric layer 113 may include a silicon compound, a metal oxide, etc. For example, the lower interlayer dielectric layer 113 may include silicon oxide, silicon nitride, silicon oxynitride, aluminum oxide, tantalum oxide, hafnium oxide, zirconium oxide, titanium oxide, etc. They may be used alone or in combinations. The lower interlayer dielectric layer 113 may be made up of a single layer or multiple layers of different materials stacked on one another.

The oxide semiconductor layer 145 may be disposed on the lower interlayer dielectric layer 113. The oxide semiconductor layer 145 may include oxide. The oxide may include one or more oxides selected from zinc (Zn), indium (In), gallium (Ga), tin (Sn) cadmium (Cd), germanium (Ge) hafnium (Hf), or a combination thereof. The oxide may include at least one of indium-gallium-zinc oxide (IGZO), zinc-tin oxide (ZTO), indium-tin oxide (IZO), etc.

A first gate insulating layer 114 may be disposed on the oxide semiconductor layer 145. The first gate insulating layer 114 may be a gate insulating film having a gate insulating function. The first gate insulating layer 114 may include a silicon compound, a metal oxide, etc. For example, the first gate insulating layer 114 may include silicon oxide, silicon nitride, silicon oxynitride, aluminum oxide, tantalum oxide, hafnium oxide, zirconium oxide, titanium oxide, etc. They may be used alone or in combinations. The first gate insulating layer 114 may be made up of a single layer or multiple layers of different materials stacked on one another.

A portion of the upper surface of the first source region and the first drain region of the oxide semiconductor layer 145 may be exposed by the first gate insulating layer 114. The first gate insulating layer 114 may be disposed to overlap the first channel region of the oxide semiconductor layer 145 in the thickness direction and may be disposed not to overlap the first source region and the first drain region.

A second conductive layer 150 may be disposed on the first gate insulating layer 114. The second conductive layer 150 may include at least one metal selected from the group consisting of: molybdenum (Mo), aluminum (Al), platinum (Pt), palladium (Pd), silver (Ag), magnesium (Mg), gold (Au), nickel (Ni), neodymium (Nd), iridium (Ir), chromium (Cr), calcium (Ca), titanium (Ti), tantalum (Ta), tungsten (W) and copper (Cu). The second conductive layer 150 may be made up of a single layer or multiple layers.

The second conductive layer 150 may include a first upper gate electrode 151. The first upper gate electrode 151 may be disposed to overlap the first gate insulating layer 114 in the thickness direction.

According to an embodiment of the present disclosure, the gate electrode of the switching transistor may be a double gate electrode including the first upper gate electrode 151 and the first lower gate electrode 131. The first upper gate electrode 151 may be electrically connected to the first lower gate electrode 131. The capacitor electrode 133 and the second gate electrode 121 may form a capacitor by interposing the upper gate insulating layer 112 between the capacitor electrode 133 and the second gate electrode 121.

An upper interlayer dielectric layer 115 may be disposed on the second conductive layer 150. The upper interlayer dielectric layer 115 may cover the first upper gate electrode 151, the side surfaces of the first gate insulating layer 114, and the exposed upper surface of the oxide semiconductor layer in the first source region and the first drain region. The upper interlayer dielectric layer 115 may include a silicon compound, a metal oxide, etc. For example, the upper interlayer dielectric layer 115 may include silicon oxide, silicon nitride, silicon oxynitride, aluminum oxide, tantalum oxide, hafnium oxide, zirconium oxide, titanium oxide, etc. They may be used alone or in combinations. The upper interlayer dielectric layer 115 may be made up of a single layer or multiple layers of different materials stacked on one another.

A fourth conductive layer 160 may be disposed on the upper interlayer dielectric layer 115. The fourth conductive layer 160 may include at least one metal selected from the group consisting of: molybdenum (Mo), aluminum (Al), platinum (Pt), palladium (Pd), silver (Ag), magnesium (Mg), gold (Au), nickel (Ni), neodymium (Nd), iridium (Ir), chromium (Cr), calcium (Ca), titanium (Ti), tantalum (Ta), tungsten (W) and copper (Cu). The fourth conductive layer 160 may be made up of a single layer or multiple layers.

The fourth conductive layer 160 may include a first source electrode 161, a first drain electrode 162, a second source electrode 164, and a second drain electrode 165. The fourth conductive layer 160 may further include a first connection electrode 163.

The first source electrode 161 and the first drain electrode 162 may be connected to the first source region and the first drain region through the contact holes CNT1 and CNT3 penetrating the upper interlayer insulating layer 115, respectively. The second source electrode 164 and the second drain electrode 165 may be connected to the second source region and the second drain region of the polycrystalline silicon semiconductor layer 105 through the contact holes CNT4 and CNT5 penetrating the upper interlayer dielectric layer 115, the lower interlayer dielectric layer 113 and the gate insulating layers 111 and 112, respectively.

The first connection electrode 163 may be connected to the first upper gate electrode 151 through a second contact hole CNT2 penetrating through the upper interlayer dielectric layer 115. The first connection electrode 163 is electrically connected to the first upper gate electrode 151, so that the resistance of the first upper gate electrode 151 can be reduced.

A first via layer 116 may be disposed over the fourth conductive layer 160. The first via layer 116 may include an inorganic insulating material or an organic insulating material such as polyacrylate resin, epoxy resin, phenolic resin, polyamide resin, polyimide resin, unsaturated polyesters resin, poly phenylen ether resin, poly phenylene sulfide resin, and benzocyclobutene (BCB). The first via layer 116 may be made up of a single layer or multiple layers of different materials stacked on one another.

A fifth conductive layer 170 may be disposed on the first via layer 116. The fifth conductive layer 170 may include a second connection electrode 171. The fifth conductive layer 170 may include at least one metal selected from the group consisting of: molybdenum (Mo), aluminum (Al), platinum (Pt), palladium (Pd), silver (Ag), magnesium (Mg), gold (Au), nickel (Ni), neodymium (Nd), iridium (Ir), chromium (Cr), calcium (Ca), titanium (Ti), tantalum (Ta), tungsten (W) and copper (Cu). The fifth conductive layer 170 may be made up of a single layer or multiple layers.

The second connection electrode 171 may be connected to the second drain electrode 165 through a contact hole that partially penetrates the first via layer 116 to expose the upper surface of the second drain electrode 165.

A second via layer 117 may be disposed on the first via layer 116 and the second connection electrode 171. The second via layer 117 may include a same material with the first via layer 116. An anode electrode 181 may be disposed on the second via layer 117. The anode electrode 181 may be connected to the second connection electrode 171 through a contact hole penetrating the second via layer 117. The anode electrode 181 may be separately disposed for each sub-pixel SP (see FIG. 2).

A bank layer 118 may be disposed on the anode electrode 181. The bank layer 118 may include an opening OP partially exposing the anode electrode 181. The bank layer 118 may be made of an organic insulating material or an inorganic insulating material. For example, the bank layer 118 may include at least one of: a photoresist, a polyimide resin, an acrylic resin, a silicon compound, a polyacrylic resin, and the like.

An organic light emitting layer 182 may be disposed on the upper surface of the anode electrode 181 and in the opening OP of the bank layer 118. A cathode electrode 183 may be disposed on the organic light emitting layer 182 and the bank layer 118. The cathode electrode 183 may be a common electrode disposed across a plurality of pixels.

The anode electrode 181, the organic light emitting layer 182 and the cathode electrode 183 may form the organic light-emitting diode 180.

An encapsulation layer 190 may be disposed on the cathode electrode 183. The encapsulation layer 190 may cover the organic light-emitting diode 180. The encapsulation layer 190 may be a stack of inorganic layers and organic layers alternately stacked on one another. For example, the encapsulation layer 190 may include a first inorganic encapsulation layer 191, an organic encapsulation layer 192 and a second inorganic encapsulation layer 193 stacked on one another in this order.

As described above, in the display device according to the embodiment, the dielectric constant of the first sub-substrate SSUB1 is lowered while the dielectric constant of the second barrier layer BA2 is increased, so that it is possible to reduce electron charging and interfacial polarization at the interface between the first sub-substrate SSUB1 and the second barrier layer BA2 in contact with each other.

Figure 10:
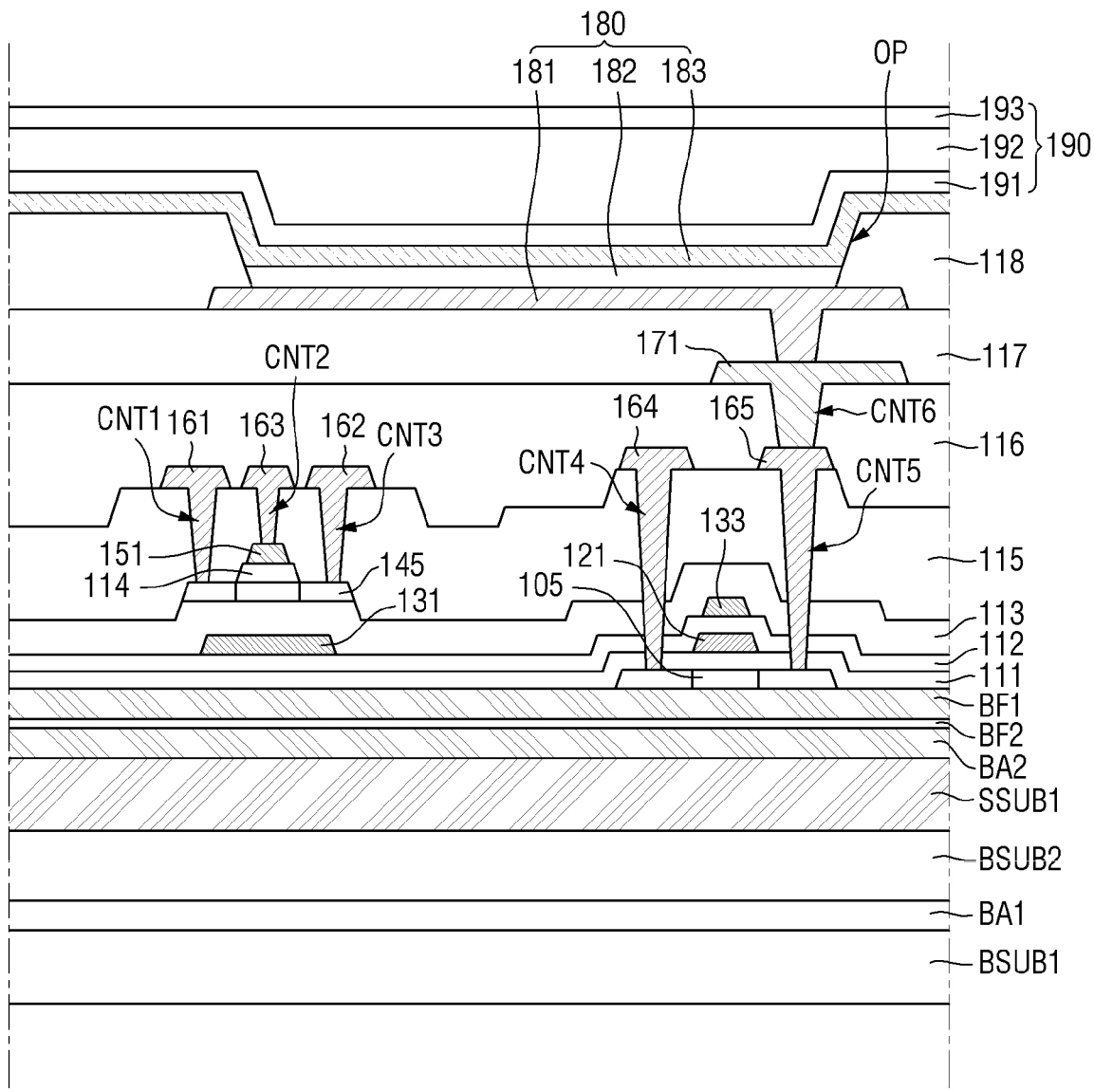
FIG. 10 is a cross-sectional view showing another example of a display device according to an embodiment of the present disclosure.
Figure 11:
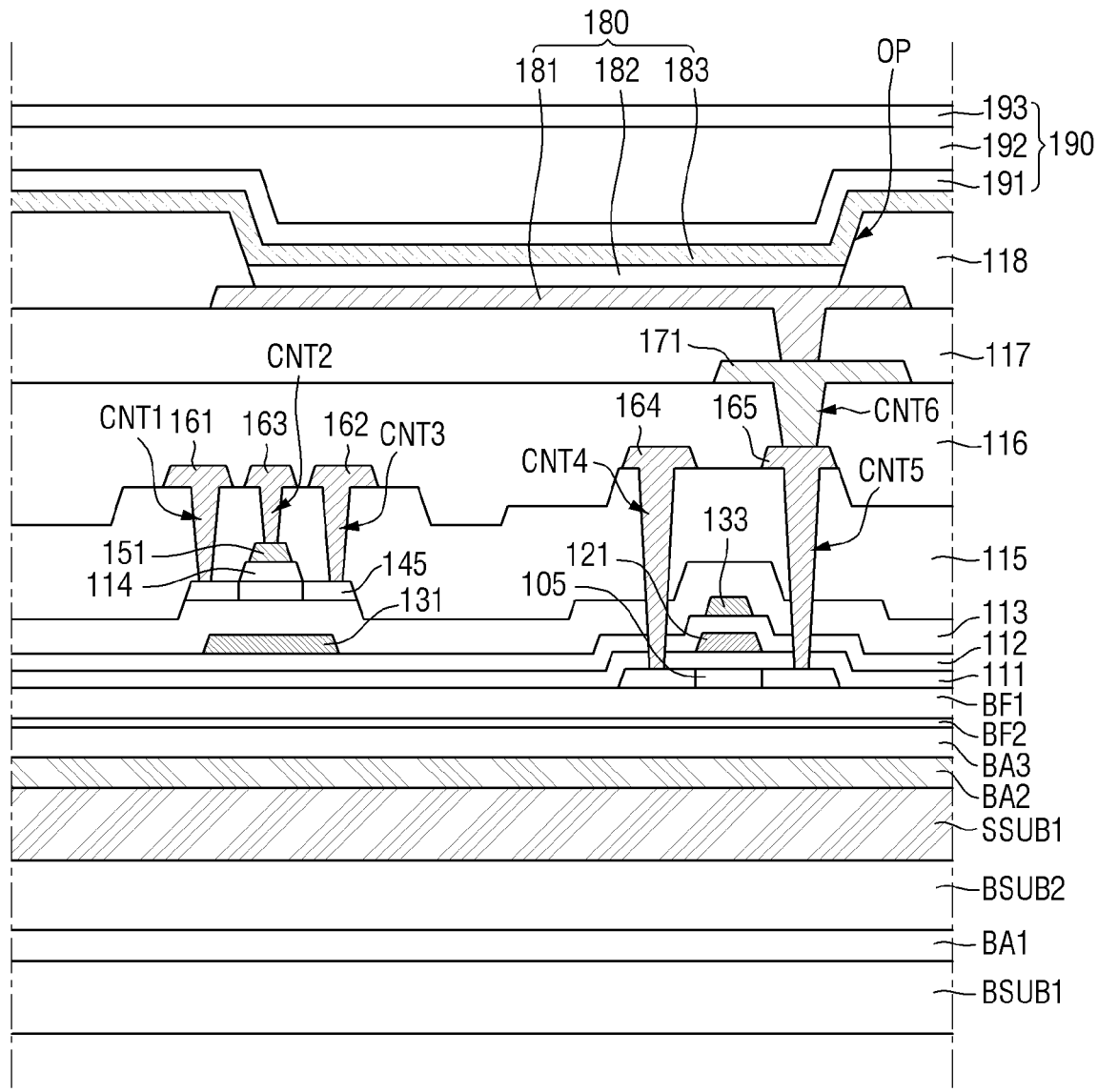
FIG. 11 is a cross-sectional view showing yet another example of the display device according to an embodiment of the present disclosure.
Figure 12:
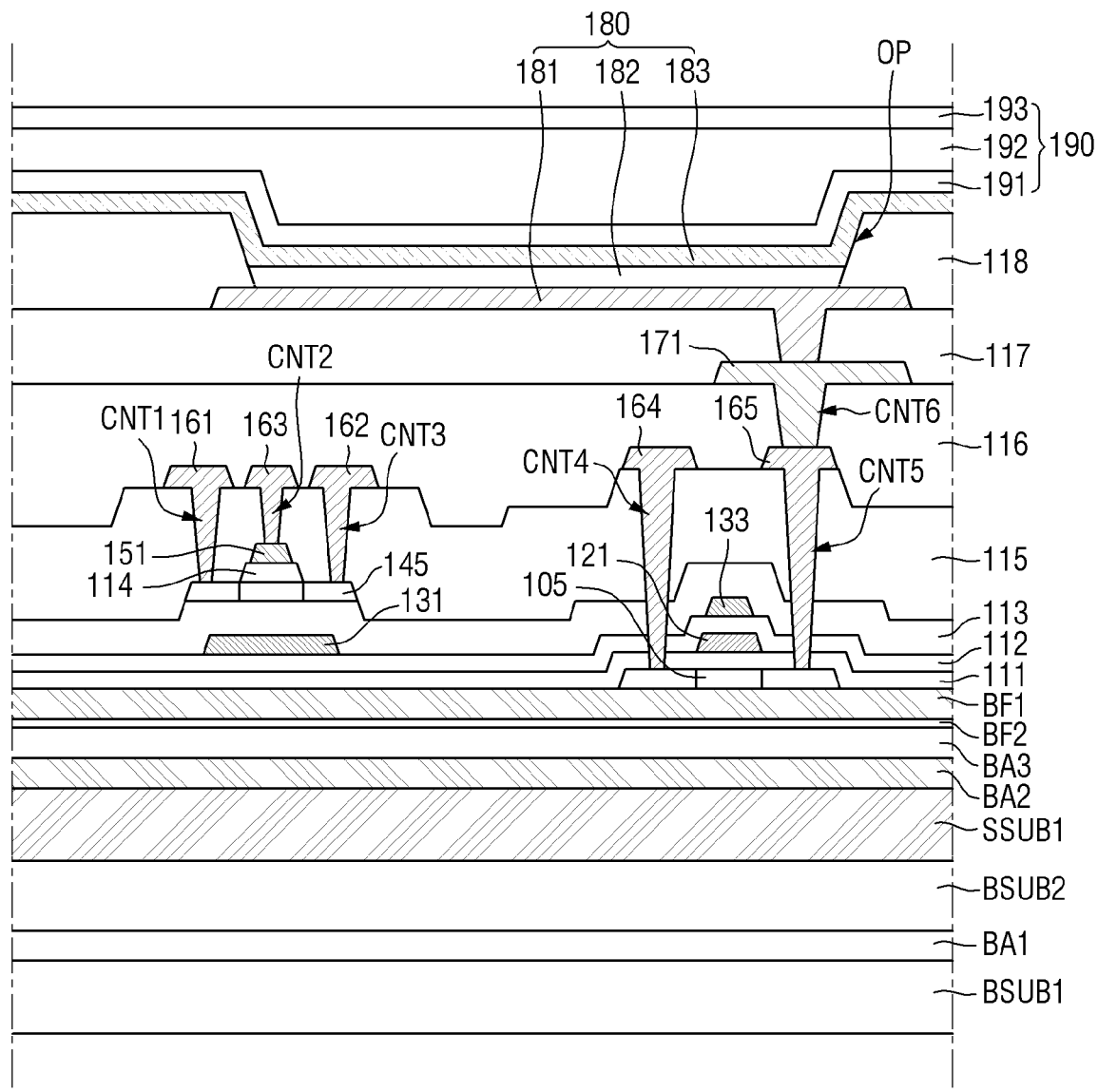
FIG. 12 is a cross-sectional view showing yet another example of the display device according to an embodiment of the present disclosure.

FIG. 10 is a cross-sectional view showing another example of a display device according to an embodiment of the present disclosure. FIG. 11 is a cross-sectional view showing yet another example of the display device according to an embodiment of the present disclosure. FIG. 12 is a cross-sectional view showing yet another example of the display device according to an embodiment of the present disclosure.

Referring to FIG. 10, in another example of the display device according to an embodiment, the first buffer layer BF1 is additionally formed of a material having a high dielectric constant, unlike the embodiment of FIG. 4, thus increasing the dielectric constant of the first buffer layer BF1. By doing so, the conductivity can be increased. The first buffer layer BF1 may be disposed under the polysilicon semiconductor layer 105 in contact with it. Since the first buffer layer BF1 is disposed in contact with the polysilicon semiconductor layer 105, if electron charging occurs in the first buffer layer BF1, the characteristics of the thin-film transistors may be greatly affected.

According to an embodiment, the first buffer layer BF1 may be formed of a material having a high dielectric constant, like the above-described second barrier layer BA2, so that it is possible to increase the dielectric constant of the first buffer layer BF1 to increase the conductivity. When the conductivity of the first buffer layer BF1 increases, the electrons charged in the first buffer layer BF1 can be dispersed. Accordingly, according to this embodiment, by increasing the conductivity by increasing the dielectric constant of the first buffer layer BF1, electron charging can be reduced.

In addition, referring to FIG. 11, in another example of the display device according to the embodiment, a third barrier layer BA3 may be further disposed between the second barrier layer BA2 and the second buffer layer BF2, unlike the embodiment of FIG. 4.

Like the first barrier layer BA1 described above, the third barrier layer BA3 can prevent diffusion of impurity ions, prevent permeation of moisture or outside air, and provide a flat surface. The third barrier layer BA3 may include silicon oxide, etc. Since the third barrier layer BA3 is made of a material having a lower dielectric constant than that of the second barrier layer BA2 in contact with it, it is possible to supplement the insulation of the second barrier layer BA2 having lowered insulation properties. In some embodiments, in order to prevent diffusion of ions such as fluorine from the first sub-substrate SSUB1 containing fluorine, etc., the third barrier layer BA3 may be further formed on the second barrier layer BA2.

Referring to FIG. 12, in yet another example of the display device according to an embodiment, the first buffer layer BF1 is additionally formed of a material having a high dielectric constant, unlike the embodiment of FIG. 11, thus increasing the dielectric constant of the first buffer layer BF1. By doing so, the conductivity can be increased.

As described above, since the first buffer layer BF1 is disposed in contact with the polysilicon semiconductor layer 105, if electron charging occurs in the first buffer layer BF1, the characteristics of the thin-film transistors may be greatly affected. Accordingly, according to this embodiment, by increasing the conductivity by increasing the dielectric constant of the first buffer layer BF1, electron charging can be reduced.

The dielectric constant of the first sub-substrate SSUB1 is smaller than the dielectric constant of the second barrier layer BA2 in the above-described embodiment. However, the first base substrate BSUB1 or the second base substrate BSUB2 may exhibit a dielectric constant smaller than that of the second barrier layer BA2 or the first barrier layer BA1.

Figure 13:
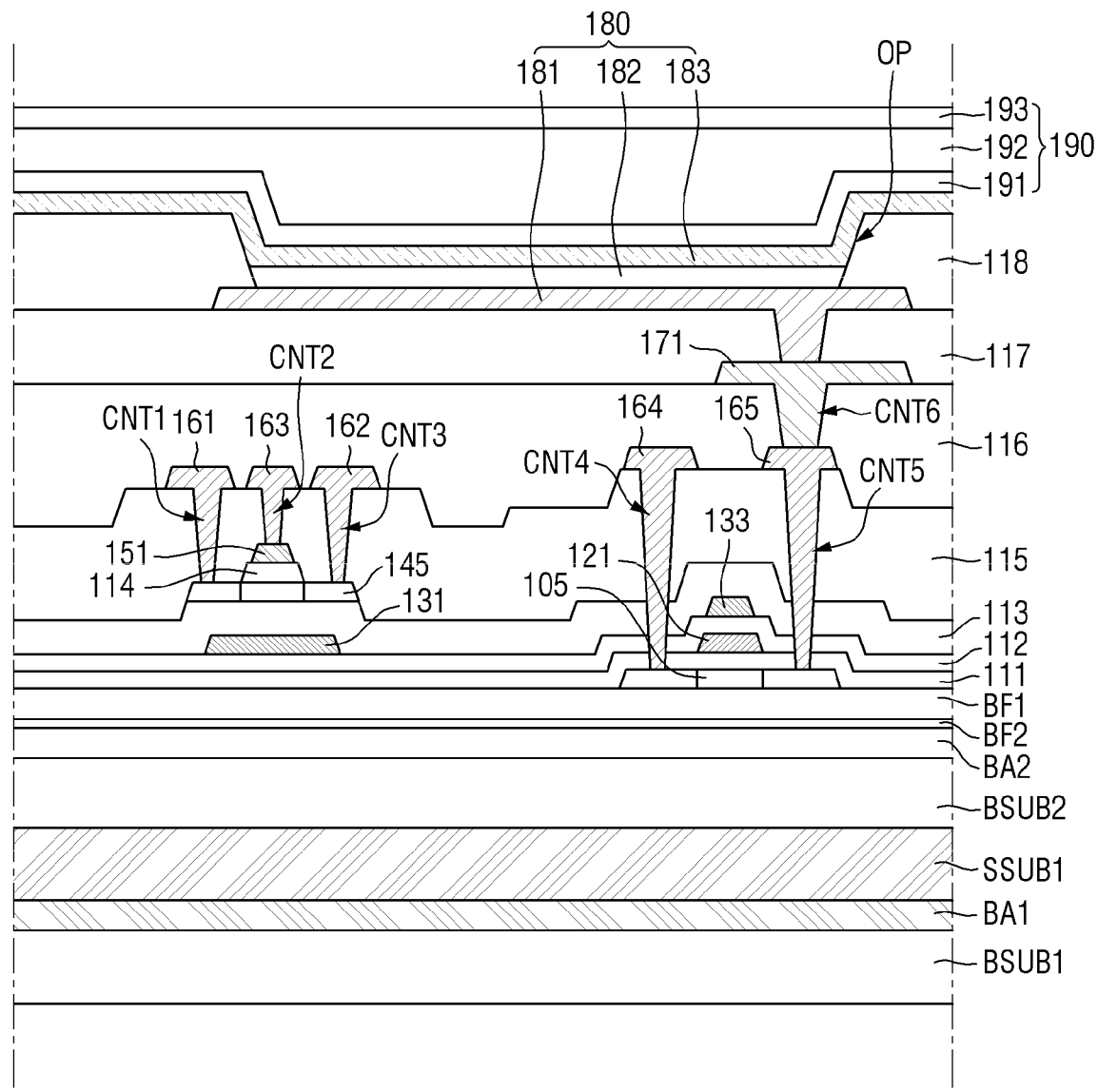
FIG. 13 is a cross-sectional view showing a display device according to an embodiment of the present disclosure.

FIG. 13 is a cross-sectional view showing a display device according to an embodiment of the present disclosure.

Referring to FIG. 13, the display device 10 according to an embodiment may include a first barrier layer BA1 disposed on a first base substrate BSUB1, a first sub-substrate SSUB1 disposed on the first barrier layer BA1, a second base substrate BSUB2 disposed on the first sub-substrate SSUB1, a second barrier layer BA2 disposed on the second base substrate BSUB2, a second buffer layer BF2 disposed on the second barrier layer BA2, a first buffer layer BF1 disposed on the second buffer layer BF2, a switching transistor ST, a driving transistor DT, and an organic light-emitting emitting diode 180 disposed on the first buffer layer BF1.

According to the embodiment of FIG. 13, the first barrier layer BA1 may be made of a material having a higher dielectric constant, and the first sub substrate SSUB1 in contact with the first barrier layer BA1 may have a lower dielectric constant.

According to an embodiment of the present disclosure, the first barrier layer BA1 may be identical to the second barrier layer BA2 of FIG. 4 described above. Specifically, the first barrier layer BA1 forms the interface in contact with the first sub-substrate SSUB1, and electron charging and interfacial polarization may occur at the interface between the first sub-substrate SSUB1 and the second barrier layer BA2.

According to this embodiment, the dielectric constant of the first barrier layer BA1 may be increased to suppress electron charging and interfacial polarization. The first barrier layer BA1 may include one selected from the group consisting of: silicon oxynitride (SiON), silicon nitride (SiNx), aluminum oxide ($Al_2O_3$), zirconium oxide ($ZrO_2$), hafnium oxide ($HfO_2$), titanium oxide ($TiO_2$), and tantalum oxide ($TaO_2$).

As the dielectric constant of the first barrier layer BA1 increases, the conductivity can increase, and thus the electrons charged at the interface with the first sub-substrate SSUB1 can be dispersed. Accordingly, according to this embodiment, by increasing the conductivity by increasing the dielectric constant of the first barrier layer BA1, electron charging can be reduced.

In addition, the first sub-substrate SSUB1 forming the interface in contact with the first barrier layer BA1 may be identical to the first sub-substrate SSUB1 of FIG. 4 described above. Specifically, the first sub-substrate SSUB1 forms the interface in contact with the first barrier layer BA1, and electron charging and interfacial polarization may occur at the interface between the first sub-substrate SSUB1 and the first barrier layer BA1. Accordingly, the first sub-substrate SSUB1 includes fluorine or boron, and accordingly decreases the dielectric constant and improves the conductivity, thus suppressing electron charging and interfacial polarization at the interface with the first barrier layer BA1.

The second base substrate BSUB2 may be disposed on the first sub-substrate SSUB1. The second base substrate BSUB2 may work as an insulating substrate by supplementing the insulating property of the first sub-substrate SSUB1 with increased conductivity.

Figure 14:
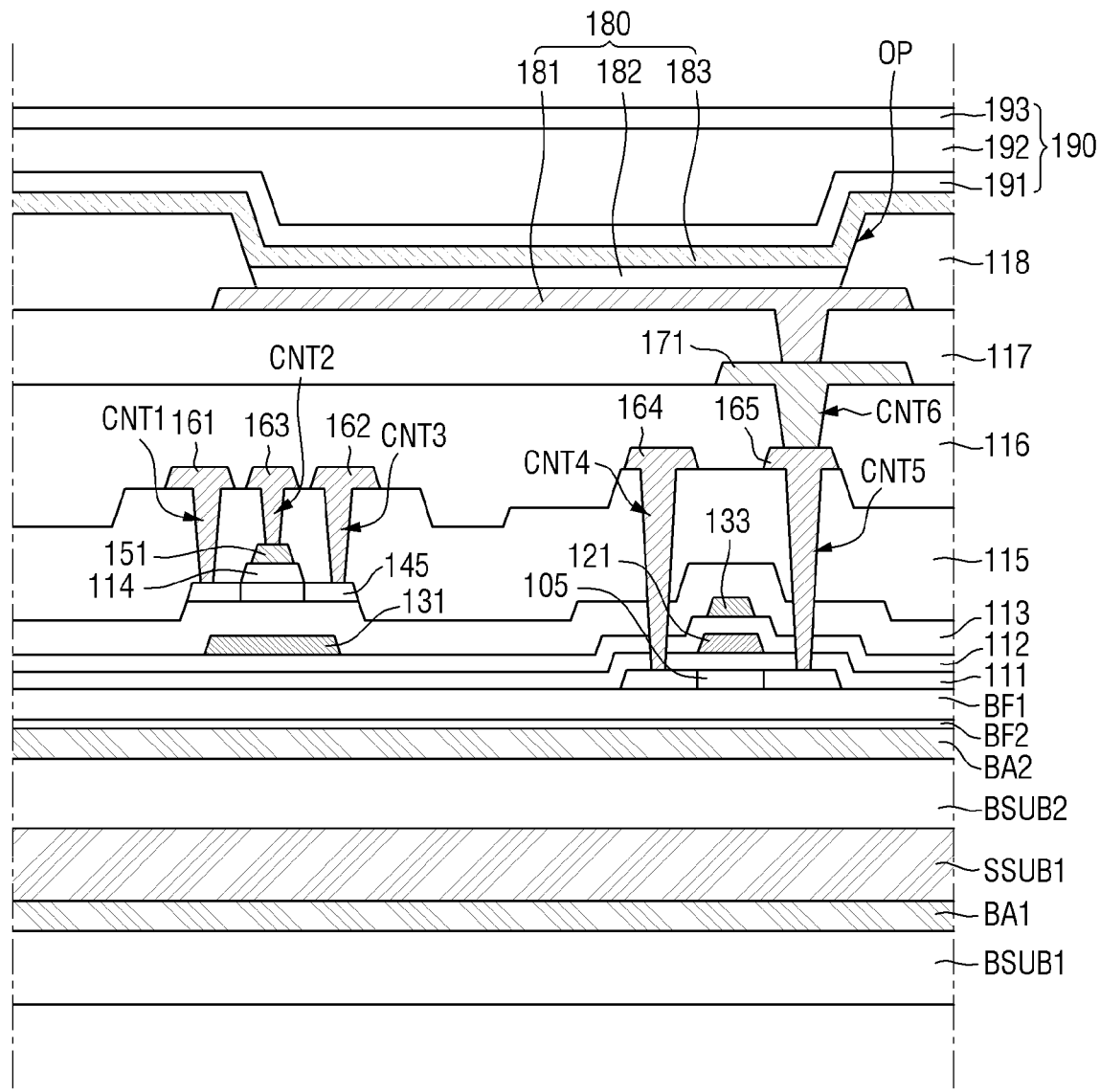
FIG. 14 is a cross-sectional view showing another example of a display device according to an embodiment of the present disclosure.
Figure 15:
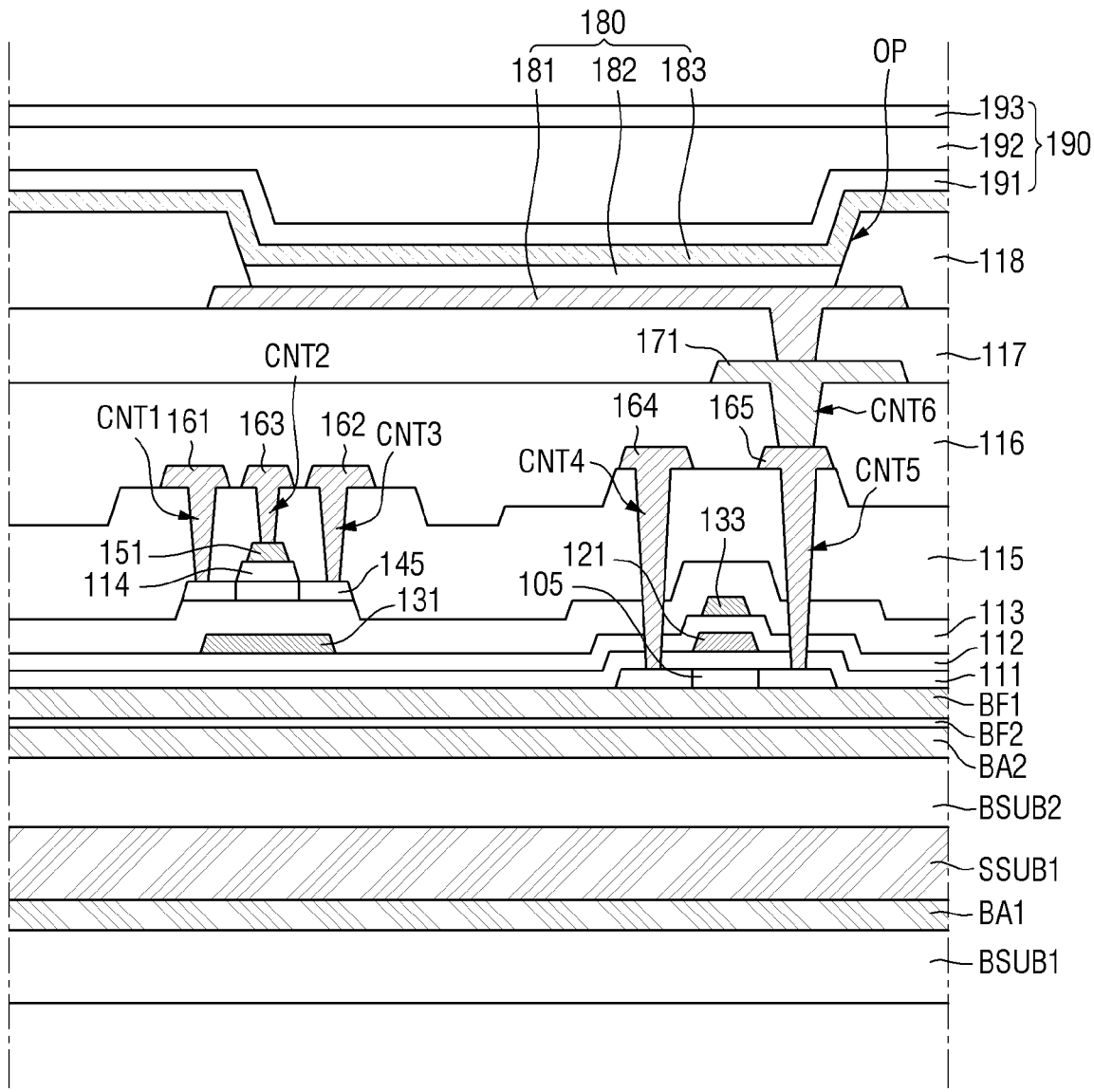
FIG. 15 is a cross-sectional view showing yet another example of the display device according to an embodiment of the present disclosure.

FIG. 14 is a cross-sectional view showing another example of a display device according to an embodiment of the present disclosure. FIG. 15 is a cross-sectional view showing yet another example of the display device according to an embodiment of the present disclosure.

Referring to FIG. 14, in another example of the display device according to an embodiment, the second barrier layer BA2 is additionally formed of a material having a high dielectric constant, unlike the embodiment of FIG. 13, thus increasing the dielectric constant of the second barrier layer BA2. By doing so, the conductivity can be increased.

The second barrier layer BA2 may be disposed on the second base substrate BSUB2 to form an interface with the second base substrate BSUB2. As described above, electron charging and interfacial polarization may occur at the interface between the second barrier layer BA2 and the second base substrate BSUB2.

According to this embodiment, by increasing the dielectric constant and conductivity of the second barrier layer BA2, the electron charging and interfacial polarization can be reduced.

Referring to FIG. 15, in yet another example of the display device according to an embodiment, the first buffer layer BF1 is additionally formed of a material having a high dielectric constant, unlike the embodiment of FIG. 14, thus increasing the dielectric constant of the first buffer layer BF1. By doing so, the conductivity can be increased.

The first buffer layer BF1 may be disposed under the polysilicon semiconductor layer 105 in contact with it. Since the first buffer layer BF1 is disposed in contact with the polysilicon semiconductor layer 105, if electron charging occurs in the first buffer layer BF1, the characteristics of the thin-film transistors may be greatly affected.

According to an embodiment, the first buffer layer BF1 may be formed of a material having a high dielectric constant, like the above-described second barrier layer BA2, so that it is possible to increase the dielectric constant of the first buffer layer BF1 to increase the conductivity. When the conductivity of the first buffer layer BF1 increases, the electrons charged in the first buffer layer BF1 can be dispersed. Accordingly, according to this embodiment, by increasing the conductivity by increasing the dielectric constant of the first buffer layer BF1, electron charging can be reduced.

Figure 16:
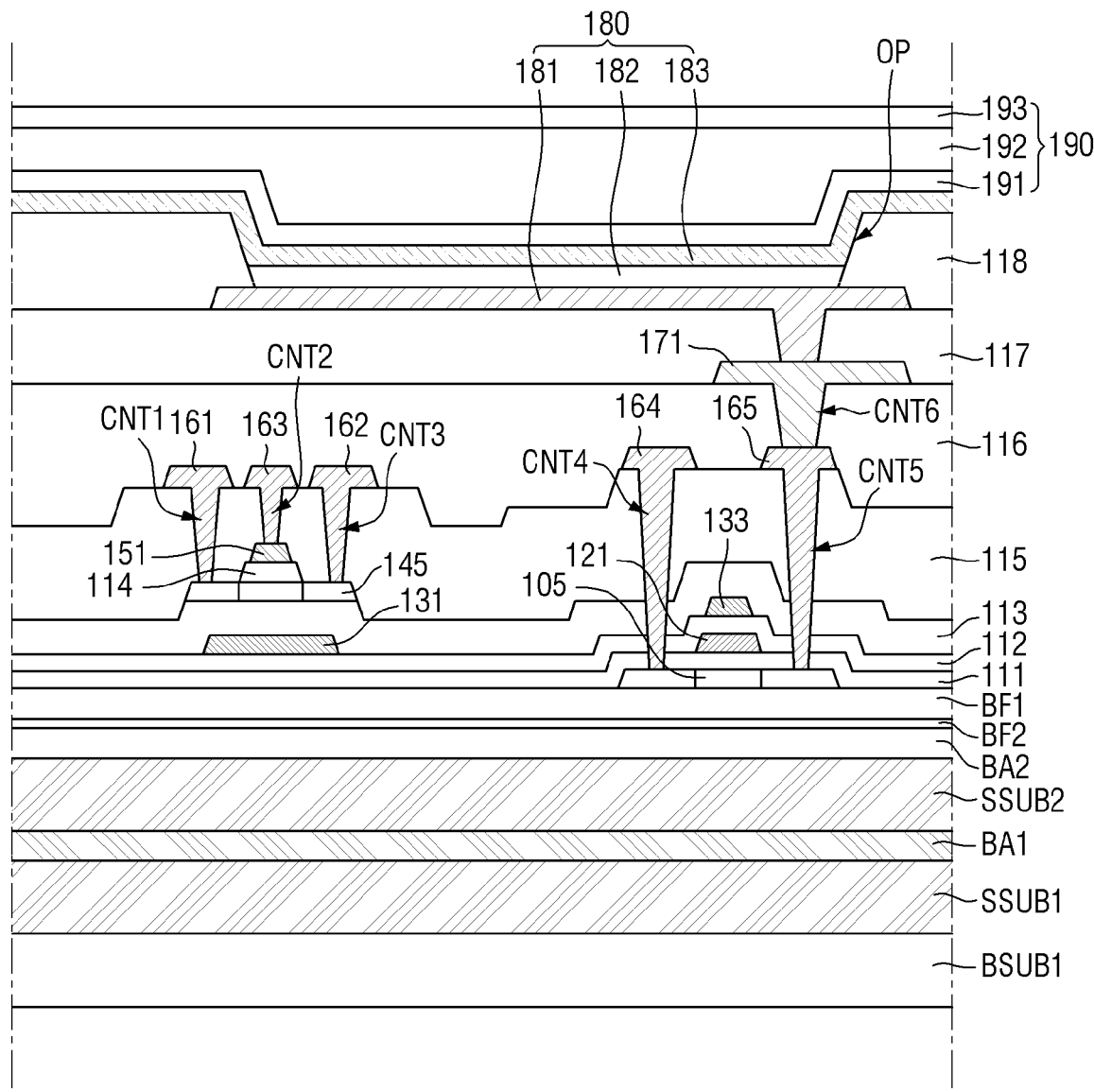
FIG. 16 is a cross-sectional view showing a display device according to an embodiment of the present disclosure.
Figure 17:
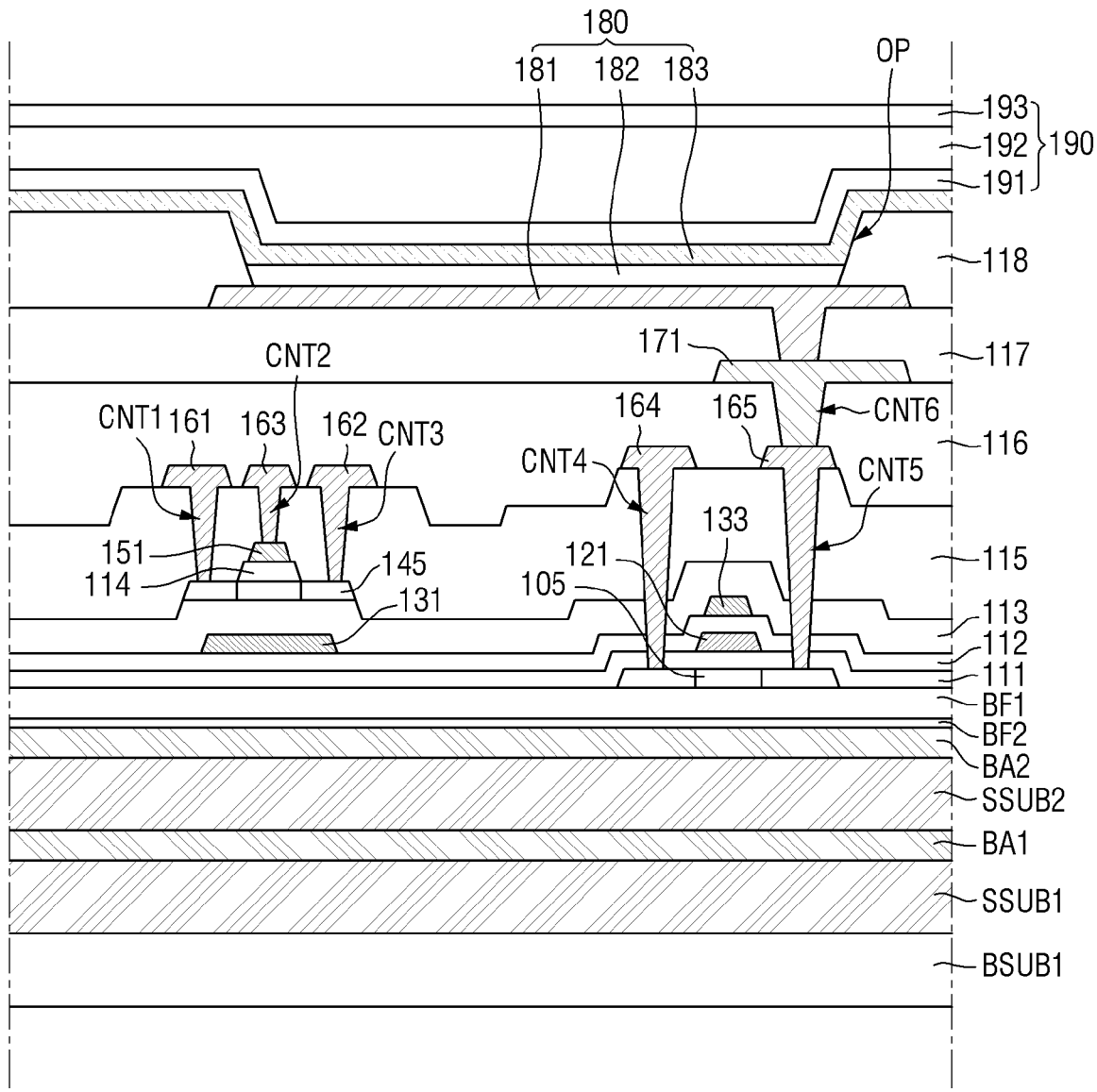
FIG. 17 is a cross-sectional view showing yet another example of a display device according to an embodiment of the present disclosure.
Figure 18:
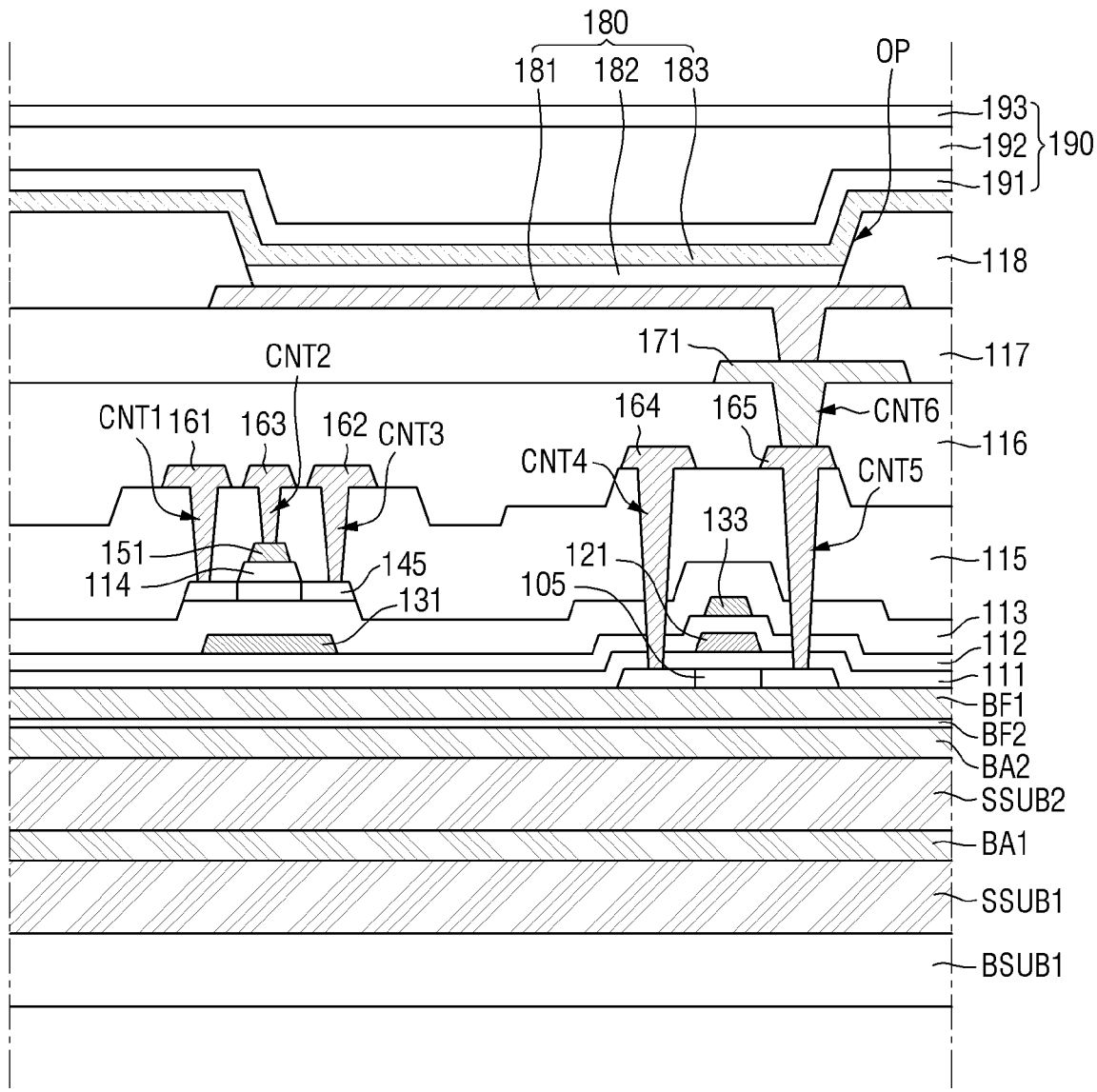
FIG. 18 is a cross-sectional view showing yet another example of a display device according to an embodiment of the present disclosure.
Figure 19:
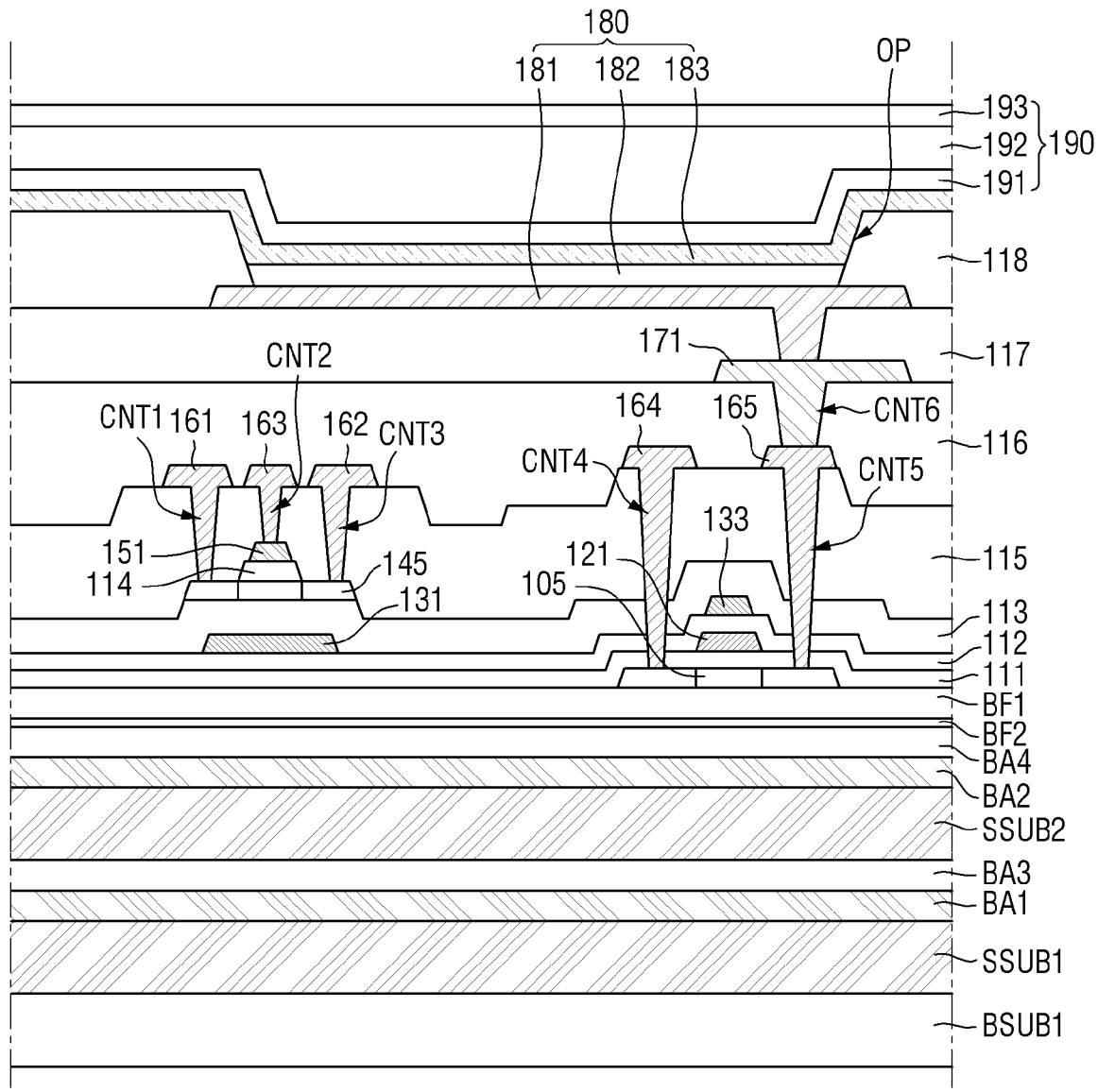
FIG. 19 is a cross-sectional view showing yet another example of a display device according to an embodiment of the present disclosure.
Figure 20:
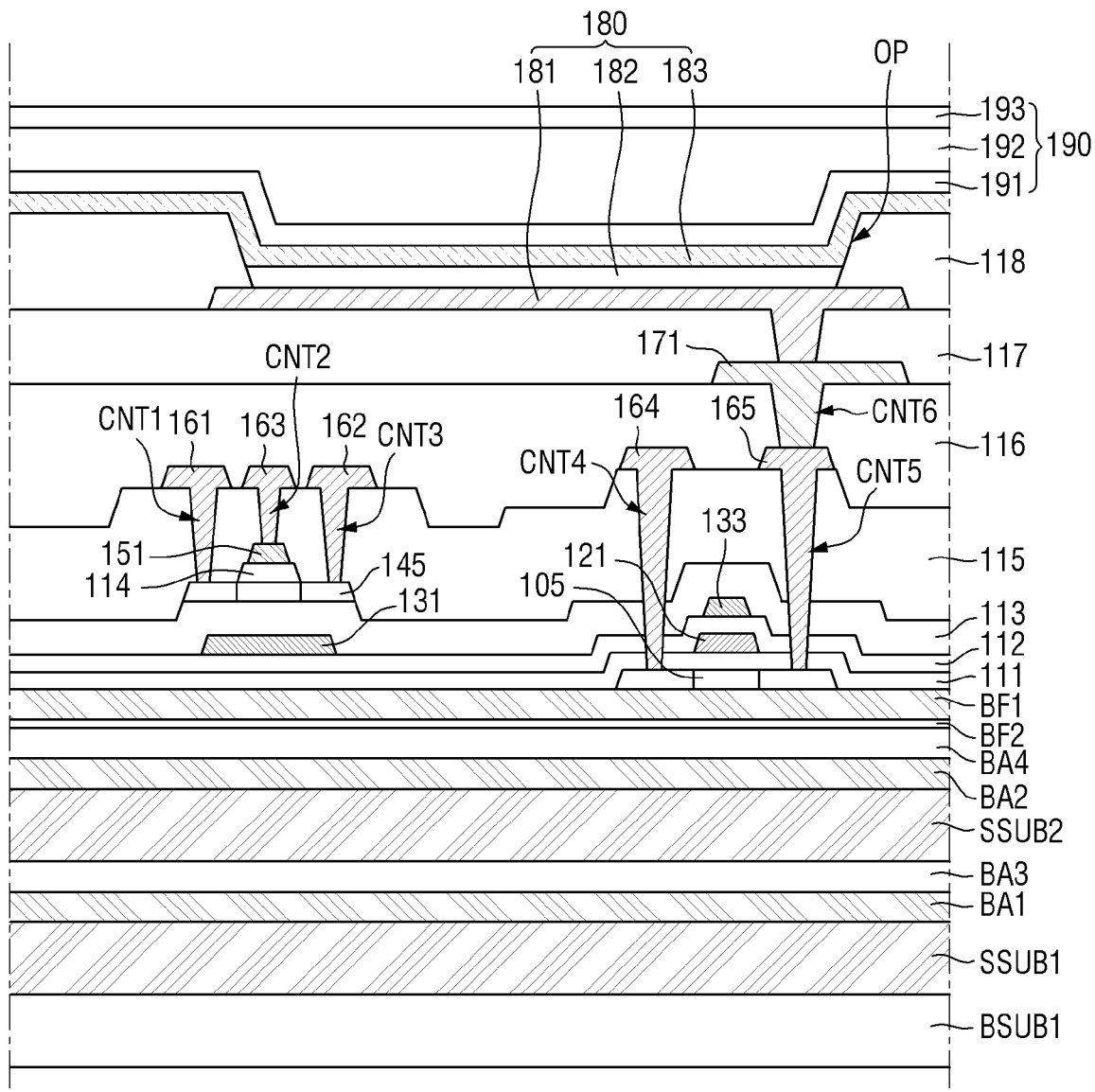
FIG. 20 is a cross-sectional view showing yet another example of a display device according to an embodiment of the present disclosure.

FIG. 16 is a cross-sectional view showing a display device according to an embodiment of the present disclosure. FIG. 17 is a cross-sectional view showing yet another example of a display device according to an embodiment of the present disclosure. FIG. 18 is a cross-sectional view showing yet another example of a display device according to an embodiment of the present disclosure. FIG. 19 is a cross-sectional view showing yet another example of a display device according to an embodiment of the present disclosure. FIG. 20 is a cross-sectional view showing yet another example of a display device according to an embodiment of the present disclosure.

Referring to FIG. 16, the display device 10 according to an embodiment may include a first sub-substrate SSUB1 disposed on the first base substrate BSUB1, a first barrier layer BA1 disposed on the first sub-substrate SSUB1, a second sub-substrate SSUB2 disposed on the first barrier layer BA1, a second barrier layer BA2 disposed on the second sub-substrate SSUB2, a second buffer layer BF2 disposed on the second barrier layer BA2, a first buffer layer BF1 disposed on the second buffer layer BF2, a switching transistor ST, a driving transistor DT and an organic light-emitting diode 180 disposed on the first buffer layer BF1.

The embodiment of FIG. 16 is different from the embodiments in that the first sub-substrate SSUB1, the first barrier layer BA1 on the first sub-substrate SSUB1 and the second sub-substrate SSUB2 on the first barrier layer BA1 are disposed between the first base substrate BSUB1 and the second barrier layer BA2.

According to an embodiment of the present disclosure, the first sub-substrate SSUB1 and the second sub-substrate SSUB2 may have a lower dielectric constant, while the first barrier layer BA1 disposed between the first sub-substrate SSUB1 and the second sub-substrate SSUB2 may be made of a material having a higher dielectric constant.

According to an embodiment of the present disclosure, the first barrier layer BA1 may be identical to the second barrier layer BA2 of FIG. 4 described above. Specifically, the first barrier layer BA1 forms an interface with each of the first sub-substrate SSUB1 and the second sub-substrate SSUB2 in contact with it, and electron charging and interfacial polarization may occur at the interface between the first sub-substrate SSUB1 and the first barrier layer BA1 and at the interface between the second sub-substrate SSUB2 and the first barrier layer BA1.

According to this embodiment, the dielectric constant of the first barrier layer BA1 may be increased to suppress electron charging and interfacial polarization. The first barrier layer BA1 may include one selected from the group consisting of: silicon oxynitride (SiON), silicon nitride (SiNx), aluminum oxide ($Al_2O_3$), zirconium oxide ($ZrO_2$), hafnium oxide ($HfO_2$), titanium oxide ($TiO_2$), and tantalum oxide ($TaO_2$).

As the dielectric constant of the first barrier layer BA1 increases, the conductivity can increase, and thus the electrons charged at the interface with the first sub-substrate SSUB1 and the interface with the second sub-substrate SSUB2 can be dispersed. Accordingly, according to this embodiment, by increasing the conductivity by increasing the dielectric constant of the first barrier layer BA1, electron charging can be reduced.

In addition, the first sub-substrate SSUB1 and the second sub-substrate SSUB2 forming the interfaces in contact with the first barrier layer BA1, respectively, may be identical to the first sub-substrate SSUB1 of FIG. 4 described above. Specifically, each of the first sub-substrate SSUB1 and the second sub-substrate SSUB2 forms the interface in contact with the first barrier layer BA1, and electron charging and interfacial polarization may occur at the interface between the first sub-substrate SSUB1 and the first barrier layer BA1 and at the interface between the second sub-substrate SSUB2 and the first barrier layer BA1. Accordingly, the first sub-substrate SSUB1 and the second sub-substrate SSUB2 include fluorine or boron, and accordingly decrease the dielectric constant and improve the conductivity, thus suppressing electron charging and interfacial polarization at the interfaces with the first barrier layer BA1.

Referring to FIG. 17, in another example of the display device according to an embodiment, the second barrier layer BA2 is additionally formed of a material having a high dielectric constant, unlike the embodiment of FIG. 16, thus increasing the dielectric constant of the second barrier layer BA2. By doing so, the conductivity can be increased.

The second barrier layer BA2 may be disposed on the second sub-substrate SSUB2 to form an interface with the second sub-substrate SSUB2. As described above, electron charging and interfacial polarization may occur at the interface between the second barrier layer BA2 and the second sub-substrate SSUB2.

According to this embodiment, by increasing the dielectric constant and conductivity of the second barrier layer BA2, the electron charging and interfacial polarization can be reduced which may occur at the interface with the second sub-substrate SSUB2.

Referring to FIG. 18, in yet another example of the display device according to an embodiment, the first buffer layer BF1 is additionally formed of a material having a high dielectric constant, unlike the embodiment of FIG. 17, thus increasing the dielectric constant of the first buffer layer BF1. By doing so, the conductivity can be increased.

The first buffer layer BF1 may be disposed under the polysilicon semiconductor layer 105 in contact with it. Since the first buffer layer BF1 is disposed in contact with the polysilicon semiconductor layer 105, if electron charging occurs in the first buffer layer BF1, the characteristics of the thin-film transistors may be greatly affected.

According to an embodiment, the first buffer layer BF1 may be formed of a material having a high dielectric constant, like the above-described second barrier layer BA2, so that it is possible to increase the dielectric constant of the first buffer layer BF1 to increase the conductivity. When the conductivity of the first buffer layer BF1 increases, the electrons charged in the first buffer layer BF1 can be dispersed. Accordingly, according to this embodiment, by increasing the conductivity by increasing the dielectric constant of the first buffer layer BF1, electron charging can be reduced.

In addition, referring to FIG. 19, in yet another example of the display device according to an embodiment, a third barrier layer BA3 disposed between the first barrier layer BA1 and the second sub-substrate SSUB2, and a fourth barrier layer BA4 disposed between second buffer layer BF2 and the second barrier layer BA2, unlike the embodiment of FIG. 18.

The third barrier layer BA3 may be disposed in contact with the first barrier layer BA1, and the fourth barrier layer BA4 may be disposed in contact with the second barrier layer BA2.

Like the first barrier layer BA1 described above with reference to FIG. 4, each of the third barrier layer BA3 and the fourth barrier layer BA4 can prevent diffusion of impurity ions, prevent permeation of moisture or outside air, and provide a flat surface. Each of the third barrier layer BA3 and the fourth barrier layer BA4 may include silicon oxide, etc. Since the third barrier layer BA3 and the fourth barrier layer BA4 is made of a material having a lower dielectric constant than that of the first barrier layer BA1 and the second barrier layer BA2, it is possible to supplement the insulation of the first barrier layer BA1 and the second barrier layer BA2 having lowered insulation properties.

In addition, in some embodiments, in order to prevent diffusion of ions such as fluorine from the first sub-substrate SSUB1 and the second sub-substrate SSUB2 containing fluorine, etc., the third barrier layer BA3 may be formed on the first barrier layer BA1 and the fourth barrier layer BA4 may be further formed on the second barrier layer BA2.

Referring to FIG. 20, in yet another example of the display device according to an embodiment, the first buffer layer BF1 is additionally formed of a material having a high dielectric constant, unlike the embodiment of FIG. 19, thus increasing the dielectric constant of the first buffer layer BF1. By doing so, the conductivity can be increased.

According to an embodiment, the first buffer layer BF1 may be formed of a material having a high dielectric constant, like the above-described second barrier layer BA2, so that it is possible to increase the dielectric constant of the first buffer layer BF1 to increase the conductivity. When the conductivity of the first buffer layer BF1 increases, the electrons charged in the first buffer layer BF1 can be dispersed. Accordingly, according to this embodiment, by increasing the conductivity by increasing the dielectric constant of the first buffer layer BF1, electron charging can be reduced.

Figure 21:
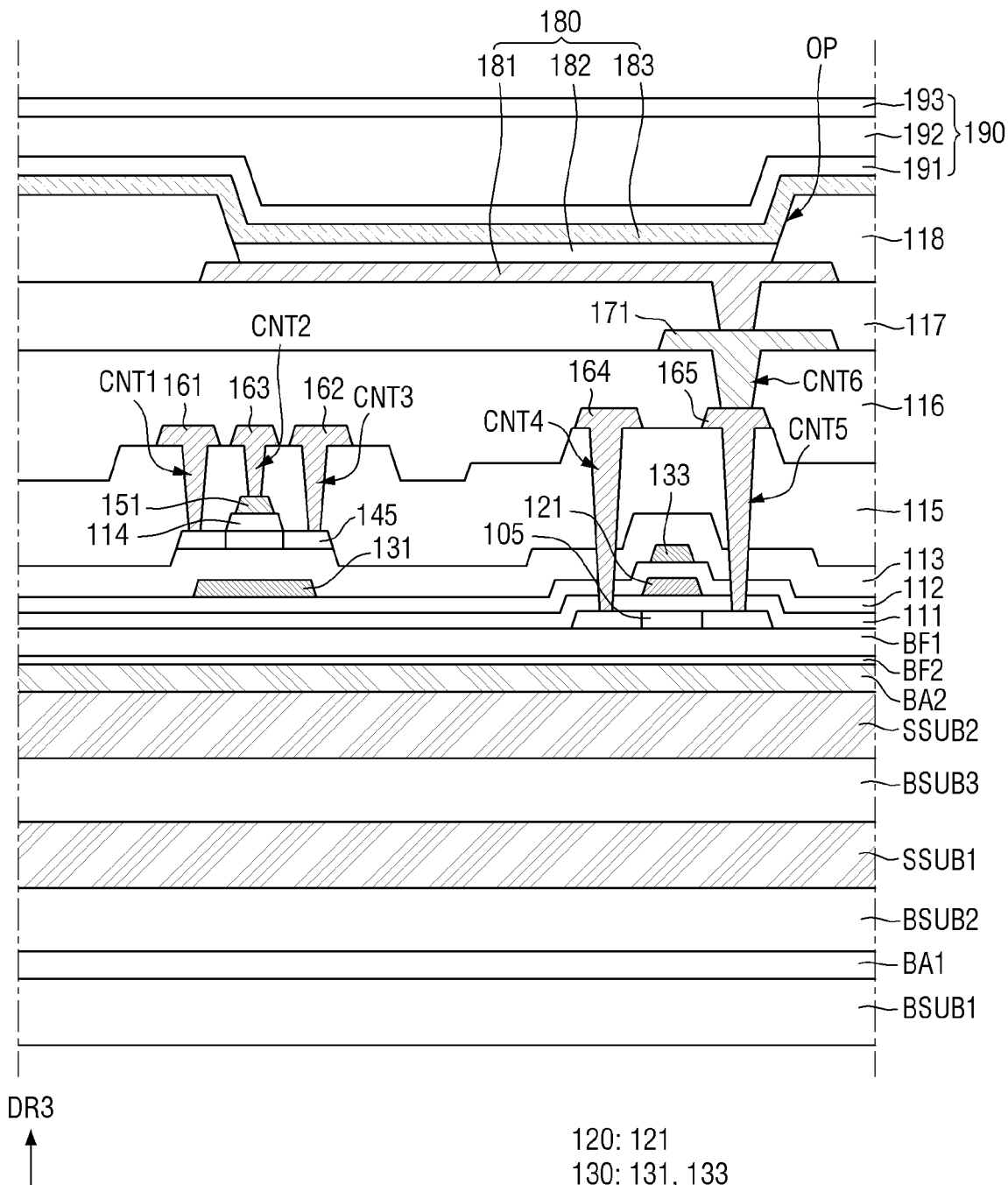
FIG. 21 is a cross-sectional view showing a display device according to an embodiment of the present disclosure.
Figure 22:
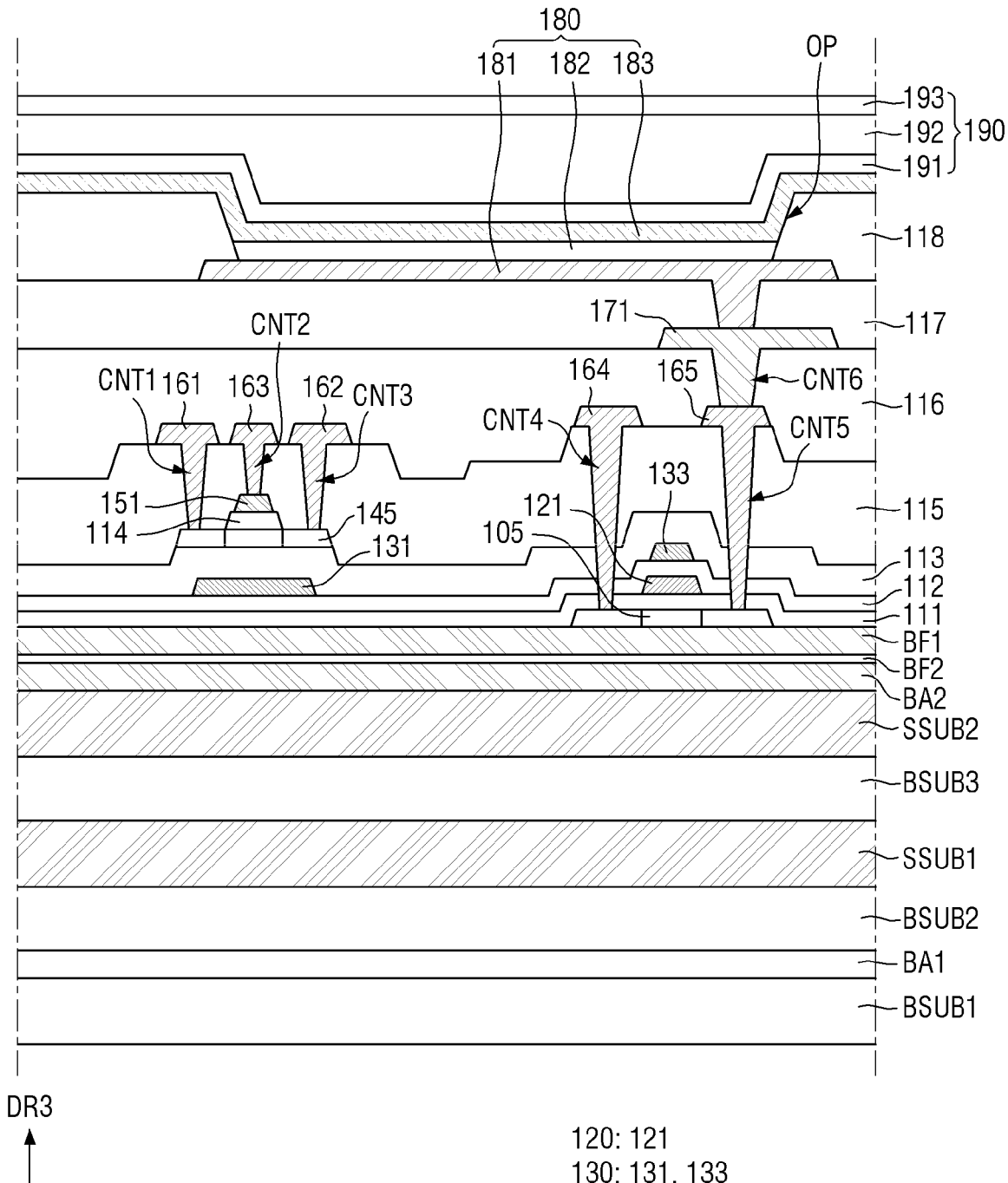
FIG. 22 is a cross-sectional view showing yet another example of a display device according to an embodiment of the present disclosure.
Figure 23:
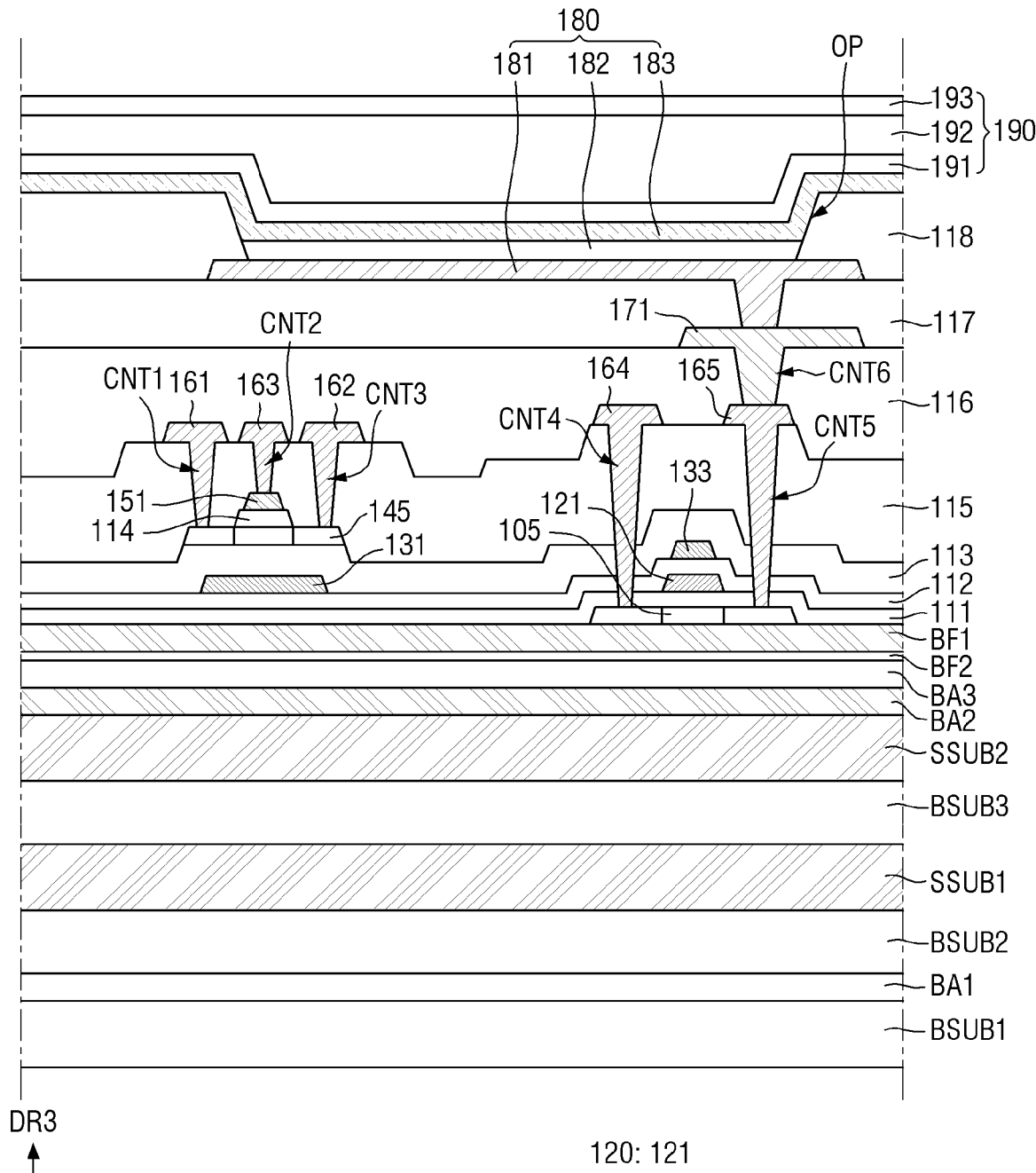
FIG. 23 is a cross-sectional view showing yet another example of a display device according to an embodiment of the present disclosure.

FIG. 21 is a cross-sectional view showing a display device according to an embodiment of the present disclosure. FIG. 22 is a cross-sectional view showing yet another example of a display device according to an embodiment of the present disclosure. FIG. 23 is a cross-sectional view showing yet another example of a display device according to an embodiment of the present disclosure.

Referring to FIG. 21, the display device 10 according to an embodiment may include a first barrier layer BA1 disposed on the first base substrate BSUB1, a second base substrate BSUB2 disposed on the first barrier layer BA1, a second sub-substrate SSUB2 disposed on the second base substrate BSUB2, a third base substrate BSUB3 disposed on the second sub-substrate SSUB2, a second sub-substrate SSUB2 disposed on the third base substrate BSUB3, a second barrier layer BA2 disposed on the second sub-substrate SSUB2, a second buffer layer BF2 disposed on the second barrier layer BA2, a first buffer layer BF1 disposed on the second buffer layer BF2, a switching transistor ST, a driving transistor DT, and an organic light-emitting diode 180 disposed on the first buffer layer BF1.

The embodiment of FIG. 21 is different from the above-described embodiment of FIG. 4 in that a first sub-substrate SSUB1, a third base substrate BSUB3 and a second sub-substrate SSUB2 between the second base substrate BSUB2 and the second barrier layer BA2. Specifically, the first sub-substrate SSUB1 may be disposed on the second base substrate BSUB2, the third base substrate BSUB3 may be disposed on the first sub-substrate SSUB1, and the second sub-substrate SSUB2 may be disposed on the third base substrate BSUB3.

According to an embodiment of the present disclosure, the first sub-substrate SSUB1 and the second sub-substrate SSUB2 may have a lower dielectric constant, while the second barrier layer BA2 disposed on the second sub-substrate SSUB2 may be made of a material having a higher dielectric constant.

The first sub-substrate SSUB1 and the second sub-substrate SSUB2 may be identical to the first sub-substrate SSUB1 of FIG. 4 described above. Specifically, the first sub-substrate SSUB1 may be disposed between the second base substrate BSUB2 and the third base substrate BSUB3 to work as a substrate together with the second base substrate BSUB2 and the third base substrate BSUB3 and can support the above-described thin-film transistors and the organic light-emitting diode. In particular, the first sub-substrate SSUB1 contains fluorine or boron, and accordingly decreases the dielectric constant and improves the conductivity, thus suppressing electron charging and interfacial polarization at the interface with the second barrier layer BSUB2 or the third base substrate BSUB3.

The second sub-substrate SSUB2 forms the interface in contact with the second barrier layer BA2, and electron charging and interfacial polarization may occur at the interface between the second sub-substrate SSUB2 and the second barrier layer BA2. Accordingly, the second sub-substrate SSUB2 includes fluorine or boron, and accordingly decreases the dielectric constant and improves the conductivity, thus suppressing electron charging and interfacial polarization at the interfaces with the second barrier layer BA2.

According to an embodiment of the present disclosure, the second barrier layer BA2 may be identical to the second barrier layer BA2 of FIG. 4 described above. Specifically, the second barrier layer BA2 forms the interface in contact with the second sub-substrate SSUB2, and electron charging and interfacial polarization may occur at the interface between the second barrier layer BA2 and the second sub-substrate SSUB2.

According to this embodiment, the dielectric constant of the second barrier layer BA2 may be increased to suppress electron charging and interfacial polarization. The second barrier layer BA2 may include one selected from the group consisting of: silicon oxynitride (SiON), silicon nitride (SiNx), aluminum oxide ($Al_2O_3$), zirconium oxide ($ZrO_2$), hafnium oxide ($HfO_2$), titanium oxide ($TiO_2$), and tantalum oxide ($TaO_2$).

As the dielectric constant of the second barrier layer BA2 increases, the conductivity can increase, and thus the electrons charged at the interface with the second sub-substrate SSUB2 can be dispersed. Accordingly, according to this embodiment, by increasing the conductivity by increasing the dielectric constant of the second barrier layer BA2, electron charging can be reduced.

Referring to FIG. 22, in another example of the display device according to an embodiment, the first buffer layer BF1 is formed of a material having a high dielectric constant, unlike the embodiment of FIG. 21, thus increasing the dielectric constant of the first buffer layer BF1. By doing so, the conductivity can be increased.

The first buffer layer BF1 may be disposed under the polysilicon semiconductor layer 105 in contact with it. Since the first buffer layer BF1 is disposed in contact with the polysilicon semiconductor layer 105, if electron charging occurs in the first buffer layer BF1, the characteristics of the thin-film transistors may be greatly affected.

According to an embodiment, the first buffer layer BF1 may be formed of a material having a high dielectric constant, like the above-described second barrier layer BA2, so that it is possible to increase the dielectric constant of the first buffer layer BF1 to increase the conductivity. When the conductivity of the first buffer layer BF1 increases, the electrons charged in the first buffer layer BF1 can be dispersed. Accordingly, according to this embodiment, by increasing the conductivity by increasing the dielectric constant of the first buffer layer BF1, electron charging can be reduced.

In addition, referring to FIG. 23, in yet another example of the display device according to an embodiment, a third barrier layer BA3 may be further disposed between the second buffer layer BF2 and the second barrier layer BA2, unlike the embodiment of FIG. 22.

The third barrier layer BA3 may be disposed in contact with the second barrier layer BA2. Like the first barrier layer BA1 described above with reference to FIG. 4, the third barrier layer BA3 can prevent diffusion of impurity ions, prevent permeation of moisture or outside air, and provide a flat surface. The third barrier layer BA3 may include silicon oxide, etc. Since the third barrier layer BA3 is made of a material having a lower dielectric constant than that of the second barrier layer BA2, it is possible to supplement the insulation of the second barrier layer BA2 having lowered insulation properties. In addition, in some embodiments, in order to prevent diffusion of ions such as fluorine from the first sub-substrate SSUB1 and the second sub-substrate SSUB2 containing fluorine, etc., the third barrier layer BA3 may be formed on the second barrier layer BA2.

In concluding the detailed description, those skilled in the art will appreciate that many variations and modifications can be made to the embodiments without substantially departing from the principles of the inventive concept. Therefore, the disclosed embodiments are used in a generic and descriptive sense only and not for purposes of limitation.

What is claimed is:

1. A display device comprising:
a first base substrate;
a first barrier layer disposed on the first base substrate;
a second base substrate disposed on the first barrier layer;
a first sub-substrate disposed on the second base substrate and comprising at least one dopant selected from a group consisting of: fluorine (F), boron (B), arsenic (As), phosphorus (P), chlorine (Cl), bromine (Br), iodine (I), astatine (At), sulfur (S), selenium (Se), argon (Ar), and tellurium (Te);
a second barrier layer disposed on the first sub-substrate;
a second buffer layer disposed on the second barrier layer;
a first buffer layer disposed on the second buffer layer;
at least one transistor disposed on the first buffer layer; and
an organic light-emitting diode disposed on the at least one transistor.

2. The display device of claim 1, wherein the first sub-substrate is in contact with the second barrier layer, and a dielectric constant of the first sub-substrate is smaller than a dielectric constant of the second barrier layer.

3. The display device of claim 2, wherein the dielectric constant and a specific resistance of each of the first sub-substrate and the second barrier layer satisfy the following relational expression:

$$\varepsilon_1 p_1 \neq \varepsilon_2 p_2$$

wherein $\varepsilon_1$ denotes the dielectric constant of the first sub-substrate, $p_1$ denotes the specific resistance of the first sub-substrate, $\varepsilon_2$ denotes the dielectric constant of the second barrier layer, and $p_2$ denotes the specific resistance of the second barrier layer.

4. The display device of claim 3, wherein a value of $\varepsilon_1 p_1$ of the first sub-substrate is greater than a value $\varepsilon_2 p_2$ of the second barrier layer.

5. The display device of claim 1, wherein the dielectric constant of the first sub-substrate ranges from 2 to 3.8.

6. The display device of claim 1, wherein a concentration of the dopant decreases from an upper surface of the first sub-substrate in contact with the second barrier layer to a lower surface of the first sub-substrate.

7. The display device of claim 1, wherein a concentration of the dopant of the first sub-substrate is uniform.

8. The display device of claim 1, wherein the second barrier comprises at least one selected from a group consisting of: SiON, SiNx, $Al_2O_3$, $ZrO_2$, $HfO_2$, $TiO_2$ and $TaO_2$.

9. The display device of claim 8, wherein the second barrier comprises at least one selected from a group consisting of: SiON, SiNx, $Al_2O_3$, $ZrO_2$, $HfO_2$, $TiO_2$ and $TaO_2$.

10. The display device of claim 8, further comprising:
a third barrier layer disposed between the second barrier layer and the second buffer layer,
wherein a dielectric constant of the third barrier layer is smaller than the dielectric constant of the second barrier layer.

11. A display device comprising:
a first base substrate;
a first barrier layer disposed on the first base substrate;
a first sub-substrate disposed on the first barrier layer and comprising at least one dopant selected from a group consisting of: fluorine (F), boron (B), arsenic (As), phosphorus (P), chlorine (Cl), bromine (Br), iodine (I), astatine (At), sulfur (S), selenium (Se), argon (Ar), and tellurium (Te);
a second base substrate disposed on the first sub-substrate;
a second barrier layer disposed on the second base substrate;
a second buffer layer disposed on the second barrier layer;
a first buffer layer disposed on the second buffer layer;
at least one transistor disposed on the first buffer layer; and
an organic light-emitting diode disposed on the at least one transistor,
wherein a surface of the first sub-substrate is in contact with the first barrier layer and an opposite surface of the first sub-substrate is in contact with the second base substrate, and
wherein a dielectric constant of the first sub-substrate is smaller than a dielectric constant of the first barrier layer and a dielectric constant of the second base substrate.

12. The display device of claim 11, wherein the first barrier layer comprises at least one selected from a group consisting of: SiON, SiNx, $Al_2O_3$, $ZrO_2$, $HfO_2$, $TiO_2$ and $TaO_2$.

13. The display device of claim 12, wherein at least one of the second barrier layer and the first buffer layer comprises at least one selected from a group consisting of: SiON, SiNx, $Al_2O_3$, $ZrO_2$, $HfO_2$, $TiO_2$ and $TaO_2$.

14. The display device of claim 12, wherein the dielectric constant of the first sub-substrate ranges from 2 to 3.8.

15. A display device comprising:
a first base substrate;
a first sub-substrate disposed on the first base substrate and comprising at least one dopant selected from a group consisting of: fluorine (F), boron (B), arsenic (As), phosphorus (P), chlorine (Cl), bromine (Br), iodine (I), astatine (At), sulfur (S), selenium (Se), argon (Ar), and tellurium (Te);
a first barrier layer disposed on the first sub-substrate;
a second sub-substrate disposed on the first barrier layer and comprising at least one dopant selected from a group consisting of: fluorine (F), boron (B), arsenic (As), phosphorus (P), chlorine (Cl), bromine (Br), iodine (I), astatine (At), sulfur (S), selenium (Se), argon (Ar), and tellurium (Te);
a second barrier layer disposed on the second sub-substrate;
a second buffer layer disposed on the second barrier layer;
a first buffer layer disposed on the second buffer layer;
at least one transistor disposed on the first buffer layer; and
an organic light-emitting diode disposed on the at least one transistor,
wherein a surface of the first barrier layer is in contact with the first sub-substrate and an opposite surface of the first barrier layer is in contact with the second sub-substrate, and
wherein a dielectric constant of the first barrier layer is greater than a dielectric constant of the first sub-substrate and a dielectric constant the second sub-substrate.

16. The display device of claim 15, wherein the second barrier layer comprises at least one selected from a group consisting of: SiON, SiNx, $Al_2O_3$, $ZrO_2$, $HfO_2$, $TiO_2$ and $TaO_2$.

17. The display device of claim 16, wherein the first buffer comprises at least one selected from a group consisting of: SiON, SiNx, $Al_2O_3$, $ZrO_2$, $HfO_2$, $TiO_2$ and $TaO_2$.

18. The display device of claim 16, further comprising:
a third barrier layer disposed between the first barrier layer and the second sub-substrate; and
a fourth barrier layer disposed between the second barrier layer and the second buffer layer,
wherein the third and fourth barrier layers have dielectric constants lower than the dielectric constants of the first and second barrier layers.

19. A display device comprising:
a first base substrate;
a first barrier layer disposed on the first base substrate;
a second base substrate disposed on the first barrier layer;
a first sub-substrate disposed on the second base substrate and comprising at least one dopant selected from a group consisting of: fluorine (F), boron (B), arsenic (As), phosphorus (P), chlorine (Cl), bromine (Br), iodine (I), astatine (At), sulfur (S), selenium (Se), argon (Ar), and tellurium (Te);
a second barrier layer disposed on the first sub-substrate;
a second buffer layer disposed on the second barrier layer;
a first buffer layer disposed on the second buffer layer;
at least one transistor disposed on the first buffer layer; and
an organic light-emitting diode disposed on the at least one transistor,
wherein the first sub-substrate is in contact with the second barrier layer,
wherein a dielectric constant and a specific resistance of each of the first sub-substrate and the second barrier layer satisfy the following relational expression:

$$\varepsilon_1 p_1 \neq \varepsilon_2 p_2$$

wherein $\varepsilon_1$ denotes the dielectric constant of the first sub-substrate, $p_1$ denotes the specific resistance of the first sub-substrate, $\varepsilon_2$ denotes the dielectric constant of the second barrier layer, and $p_2$ denotes the specific resistance of the second barrier layer.

20. The display device of claim 19, wherein a value of $\varepsilon_1 p_1$ of the first sub-substrate is greater than a value $\varepsilon_2 p_2$ of the second barrier layer.

21. The display device of claim 19, wherein the second barrier comprises at least one selected from a group consisting of: SiON, SiNx, $Al_2O_3$, $ZrO_2$, $HfO_2$, $TiO_2$ and $TaO_2$.

* * * * *